United States Patent
Yong

(10) Patent No.: US 8,786,340 B1
(45) Date of Patent: Jul. 22, 2014

(54) APPARATUSES, METHODS, AND CIRCUITS INCLUDING A DELAY CIRCUIT HAVING A DELAY THAT IS ADJUSTABLE DURING OPERATION

(71) Applicant: Micron Technology, Inc., Boise, ID (US)

(72) Inventor: Gideon Yong, New Brighton, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/869,581

(22) Filed: Apr. 24, 2013

(51) Int. Cl.
*H03L 7/06* (2006.01)
*H03L 7/08* (2006.01)

(52) U.S. Cl.
CPC ........................... *H03L 7/08* (2013.01)
USPC .......................................... 327/158; 327/147

(58) Field of Classification Search
USPC .................................................. 327/149, 158
See application file for complete search history.

(56) References Cited

U.S. PATENT DOCUMENTS

| 5,561,692 | A | 10/1996 | Maitland et al. | |
|---|---|---|---|---|
| 6,348,828 | B1 | 2/2002 | Barnes | |
| 7,525,356 | B2 * | 4/2009 | Hui et al. | 327/161 |
| 7,816,962 | B2 * | 10/2010 | Kim | 327/158 |
| 7,821,317 | B2 * | 10/2010 | Jang | 327/295 |
| 7,932,765 | B2 * | 4/2011 | Kapusta et al. | 327/269 |
| 8,237,474 | B2 * | 8/2012 | Gomm et al. | 327/149 |
| 8,421,430 | B2 * | 4/2013 | Sasaki et al. | 323/283 |
| 8,519,758 | B2 * | 8/2013 | Lee et al. | 327/158 |
| 8,570,082 | B1 * | 10/2013 | Kuo et al. | 327/158 |
| 8,598,930 | B2 * | 12/2013 | Pellerano et al. | 327/159 |
| 2011/0267118 | A1 * | 11/2011 | Shin | 327/158 |

OTHER PUBLICATIONS

De Caro, "Glitch-Free NAND-Based Digitally Controlled Delay-Lines", Senior Member, IEEE, 2012, 1-12.

* cited by examiner

*Primary Examiner* — Adam Houston
(74) *Attorney, Agent, or Firm* — Dorsey & Whitney LLP

(57) ABSTRACT

Apparatuses and methods for delaying signals using a delay circuit are described. An example apparatus includes a controller configured to set a delay length. The example apparatus further includes a delay circuit coupled to the controller. The delay circuit may include active delay stages of a plurality of delay stages that are configured to delay a first signal based on the delay length. Based on an increase to the delay length, the delay circuit is further configured to activate another delay stage of the plurality of delay stages responsive to a second signal that is based on the first signal.

25 Claims, 13 Drawing Sheets

US 8,786,340 B1

APPARATUSES, METHODS, AND CIRCUITS INCLUDING A DELAY CIRCUIT HAVING A DELAY THAT IS ADJUSTABLE DURING OPERATION

TECHNICAL FIELD

Embodiments of the disclosure relate generally to delay circuits, and more particularly, in one or more of the illustrated embodiments, to control a delay circuit to adjust its delay.

DESCRIPTION OF RELATED ART

Delay circuits are designed to delay a signal by a delay, which may be adjustable for some delay circuits, for example, often to synchronize two clock signals. For example, the delay circuit may be controlled to adjust the delay until the two clock signals are synchronized. Conventional delay circuits have a series of delay stages that are coupled together serially with exit tree circuitry configured to tap an output of any particular delay stage to provide a desired delay. Generally, an adjustment in delay of a delay circuit can occur at any time in a signal cycle, which often leads to unpredictable timing of the signal at an output of the delay circuit. This unpredictable behavior can cause anomalies in downstream circuitry using the signal provided from the delay circuit. Due to the unpredictability, the signal is often decoupled from the downstream circuitry during an adjustment of the delay and until the signal has stabilized from the delay circuit. Decoupling the signal until it has stabilized, however, may be disruptive and cause operational delays while waiting for the signal to stabilize.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
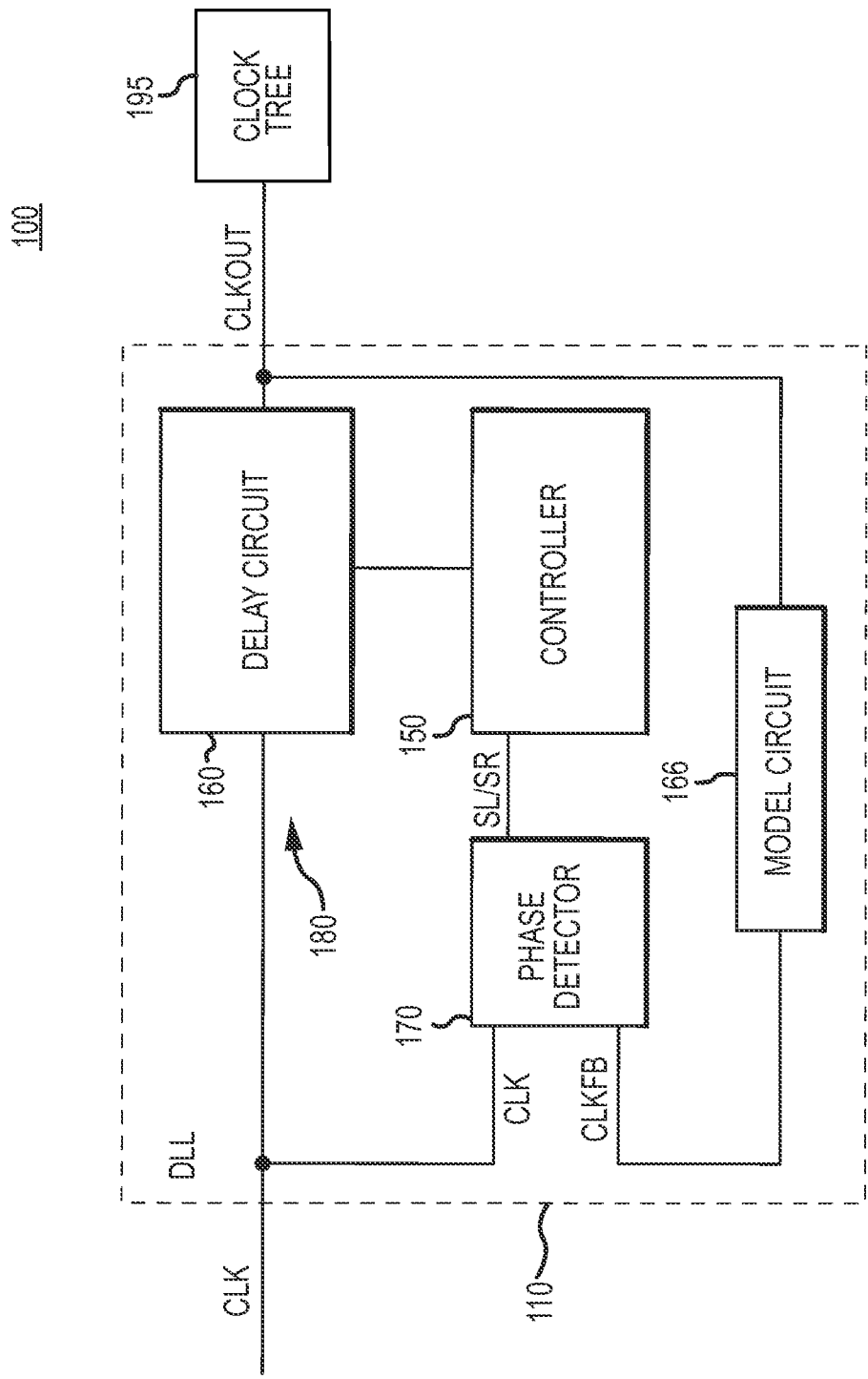
FIG. 1 is a block diagram of a particular illustrative embodiment of an apparatus including a delay-locked loop.

Referring to FIG. 1, a particular illustrative embodiment of an apparatus including a delay-locked loop (DLL) is disclosed and generally designated 100. As used herein, examples of apparatuses may include an integrated circuit, a memory device, a memory system, an electronic device or system, a smart phone, a tablet, a computer, a server, etc. The apparatus 100 may include a DLL circuit 110, which includes a delay circuit 160. The delay circuit 160 may receive an input signal CLK and apply a delay to the CLK signal to provide an output signal CLKOUT signal. The delay circuit 160 may include a coarse delay circuit coupled to a fine delay circuit that, together, delay the CLK signal to provide the CLKOUT signal. The delay circuit 160 may be configured to remain coupled to a clock tree 195 while adjusting a delay during operation by synchronizing the adjustment with an edge of the CLK signal. By synchronizing adjustment of a delay with an edge of the CLK signal, a stable CLKOUT signal may continue to be provided during the adjustment.

The delay of the delay circuit 160 may be adjusted based on a comparison between a phase of a feedback signal CLKFB (e.g., the CLKOUT delayed by a model circuit 166) and a phase of the CLK signal at a phase detector 170. The phase detector 170 provides shift signals SL/SR to a controller 150 that are indicative of a difference between the phases of the CLKFB and CLK signals. Responsive to the SL/SR signals, the controller 150 provides control signals to control the delay circuit 160 to adjust the delay. The controller 150 may include a shift register that is used to provide the control signals to control the delay circuit 160 based on the SL/SR signals. For example, in an embodiment, the controller 150 provides control signals that control the delay circuit to decrease the number of active delay stages responsive to an active SL signal (e.g., "shift left"), and as a result, decrease the delay of the delay circuit 160. The controller 150 may provide control signals that control the delay circuit to increase the number of active delay stages responsive to an active SR signal (e.g., "shift right"), and as a result, increase the delay of the delay circuit 160.

The CLKOUT signal is provided to a model circuit 166, which further delays the CLKOUT signal to provide the CLKFB signal. The model circuit 166 may model a propagation delay of at least a portion of the circuitry (not shown) of the apparatus 100, for example, an output buffer, an input buffer, a signal distribution network, and/or other circuits.

In operation, the controller 150 may control the delay circuit 160 adjust the delay based on a phase relationship between the CLK signal and the CLKFB signal. For example, the phase detector 170 is configured to detect a phase difference between the CLK signal and the CLKFB signal (e.g., the CLKOUT signal delayed through the model circuit 166). Based on a detected phase difference, the phase detector 170 may provide the SL/SR signals to reduce the phase difference. Detecting to phase difference and providing the SL/SR signal is repeated to synchronize (e.g., in phase with each other) the CLK and the CLKFB signals. In an embodiment, the SL/SR signal may include a shift right (SR) signal and/or a shift left (SL) signal. In other embodiments, signals other than shift signals may be provided by the phase detector 170 to indicate a phase difference between the CLK and CLKFB signals.

The controller 150 may provide control signals responsive to the SL/SR signals to control the delay circuit 160 to adjust the delay applied to the CLK signal. For example, when shifting to the left, the controller 150 controls the delay circuit 160 to have fewer active delay stages to decrease the length of the delay applied to the CLK signal. Alternatively, when shifting to the right, the controller 150 controls the delay circuit 160 to have more active delay stages to increase the length of the delay applied to the CLK signal. By adjusting the delay applied to the CLK signal, the timing of the CLKFB signal is adjusted accordingly. The delay circuit 160 may provide fine delay by mixing signals (not shown) within the fine delay circuit prior to providing the CLKOUT signal. The delay circuit 160 may be configured to control adjustment of a number of active delay stages and to perform fine tuning during operation while remaining coupled to the clock tree 195. When the CLK and CLKFB signals are synchronized, the phase detector 170 may provide SL/SR signals that maintain the delay through the delay circuit 160.

Propagation delay though the delay circuit 160 may vary due to voltage and temperature changes. The ability of the delay circuit 160 to adjust a number of active delay stages, and fine tune the delay during normal operation with minimal clock shifting increases reliability of circuitry of the apparatus 100 using the CLKOUT signal. Further, delay through the delay circuit 160 may be adjusted without having to decouple the CLKOUT signal to from the clock tree 195, which improves efficiency and reduces down-time of the apparatus 100.

Figure 2:
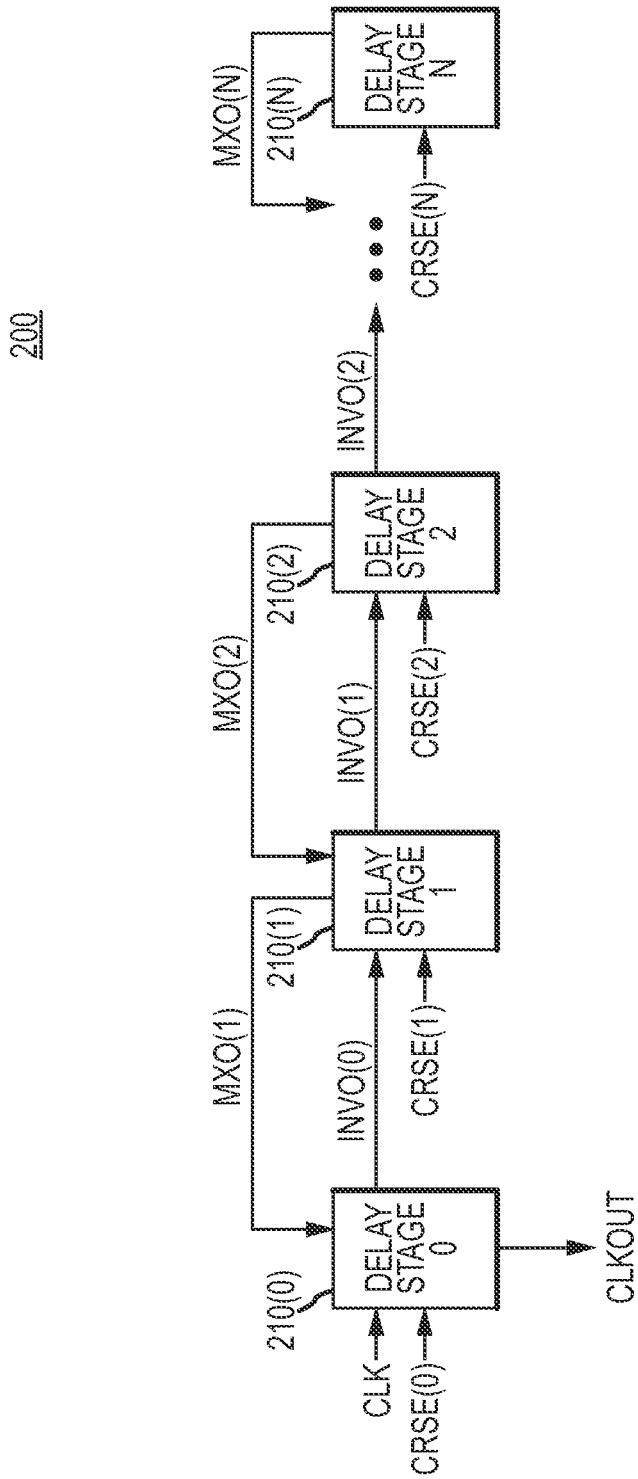
FIG. 2 is a block diagram of a particular illustrative embodiment of a coarse delay circuit having delay stages.

Referring to FIG. 2, a particular illustrative embodiment of a coarse delay circuit having delay stages 210(0-N) is disclosed and generally designated 200. The coarse delay circuit 200 may be expanded to include any number of delay stages 210(0-N). The delay stages 210(1-N) may be coupled to adjacent delay stages. The coarse delay circuit 200 may be configured to delay an input signal CLK through active delay stages of the delay stages 210(0-N) to provide an output signal CLKOUT. In an embodiment, the delay stages 210(1-N) may have the same architecture. A number of active stages of the delay stages 210(0-N) may be adjusted based on coarse delay stage control signals CRSE(0-N). In some embodiments, timing of an adjustment in the number active stages of the delay stages 210(0-N) may be associated with an edge of a signal corresponding to the CLK signal. Timing the adjustment with an edge of the signal corresponding to the CLK signal may reduce a likelihood of operational delays by producing a stable CLKOUT signal during the adjustment. The delay circuit 160 of FIG. 1 may include the coarse delay circuit 200.

Each delay stage 210(0-N) is configured to be activated or deactivated based on a respective control signal CRSE(0-N). A first delay stage 210(0) of the coarse delay circuit 200 may be configured to receive the CLK signal and to provide the CLKOUT signal that is delayed relative to the CLK signal based on a delay through the active delay stages of delay stages 210(0-N). The delay stages 210(0-N-1) may be configured to provide a respective inverter output signal INVO(0-N-1) to a subsequent delay stage 210(1-N) and to receive a respective multiplexer out signal MXO(1-N) from the subsequent delay stage 210(1-N). As will be explained further with reference to FIG. 3, the delay stages 210(0-N) include one or more delay gates configured to delay a signal. The CRSE(0-N) signal may be provided to the respective delay stages of the delay stages of the delay stages 210(0-N) via a delay circuit controller (not shown), such as the controller 150 of FIG. 1.

During operation, one or more delay stages of the delay stages 210(0-N) may be activated based on a respective asserted CRSE(0-N) signal. The activated delay stages 210(0-N) may form a delay path through the coarse delay circuit 200. The delay path may include a loop starting from the CLK signal input of the first delay stage 210(0), passing through each active delay stage to a first deactivated delay stage of the delay stages 210(0-N) (e.g., based on the respective CRSE(0-N) signal being de-asserted), and at the first deactivated delay stage 210(0-N), returning to the CLKOUT signal output of the first delay stage 210(0) via a feedback path though each active delay stage. The delay stages 210(0-N) are activated sequentially starting with the first delay stage 210(0) until a desired delay is achieved. For example, the delay path may extend through one or more of the delay stages 210(0-N) via the respective INVO(0-N) signals to the first deactivated delay stage of the delay stages 210(0-N), and return to the CLKOUT signal output of the first delay stage 210(0) via the respective MXO(0-N) signals of each active delay stage(0-N).

As relative timing between signals change, e.g., due to changes in voltage, temperature, etc., adjustment of the delay applied to the CLK signal may be required, e.g., a delay through the coarse delay circuit 200 may need to be increased or decreased. In an embodiment, a delay through the coarse delay circuit 200 may be increased by increasing the number of active delay stages of the delay stages 210(0-N) and decreased by decreasing the number of active delay stages. For example, a first deactivated delay stage of the delay stages 210(0-N) may be activated by asserting the respective CRSE(0-N) signal to increase a delay applied to the CLK signal. Further, the last active delay stage of the delay stages 210(0-N) may be deactivated by de-asserting CRSE(0-N) signal to decrease a delay applied to the CLK signal.

Each of the delay stages 210(1-N) is configured to control its transition from inactive to active based on the respective INVO(0-N) signal received from the preceding delay stage (and the CLK signal in the case of the first delay stage 210(0)). For example, based on the respective CRSE(0-N) signal associated with the first deactivated delay stage transitioning to an asserted value, the first deactivated delay stage of the delay stages 210(0-N) may be configured to initiate the transition from deactivated to activated responsive to an edge of the respective INVO(0-N) signal (e.g., a transition of the respective INVO(0-N) signal from a first logical value to a second logical value, such as a rising edge or a falling edge). Relative timing of completion of the transition to activated will be described further with respect to FIGS. 3-5. Further, based on the CRSE(0-N) signal associated with the last active delay stage of the delay stages 210(0-N) transitioning to a de-asserted value, the last active delay stage may be configured to initiate a transition from activated to deactivated responsive to the edge of the respective INVO(0-N) signal. In some embodiments, the edge of the INVO(0-N) may correspond to a transition from a logical low value to a logical high value, (e.g., via a rising edge).

Timing the transition from inactive to active, and vice versa, responsive to an edge of the respective INVO(0-N) signal at the coarse delay circuit 200 may prevent unpredictable behavior of the CLKOUT signal during the transition, for example, excessively short or long pulses. The reduction of unpredictable behavior allows the coarse delay circuit 200 to adjust a delay without a need to decouple the CLKOUT signal from circuitry (not shown) during the transition.

Figure 3:
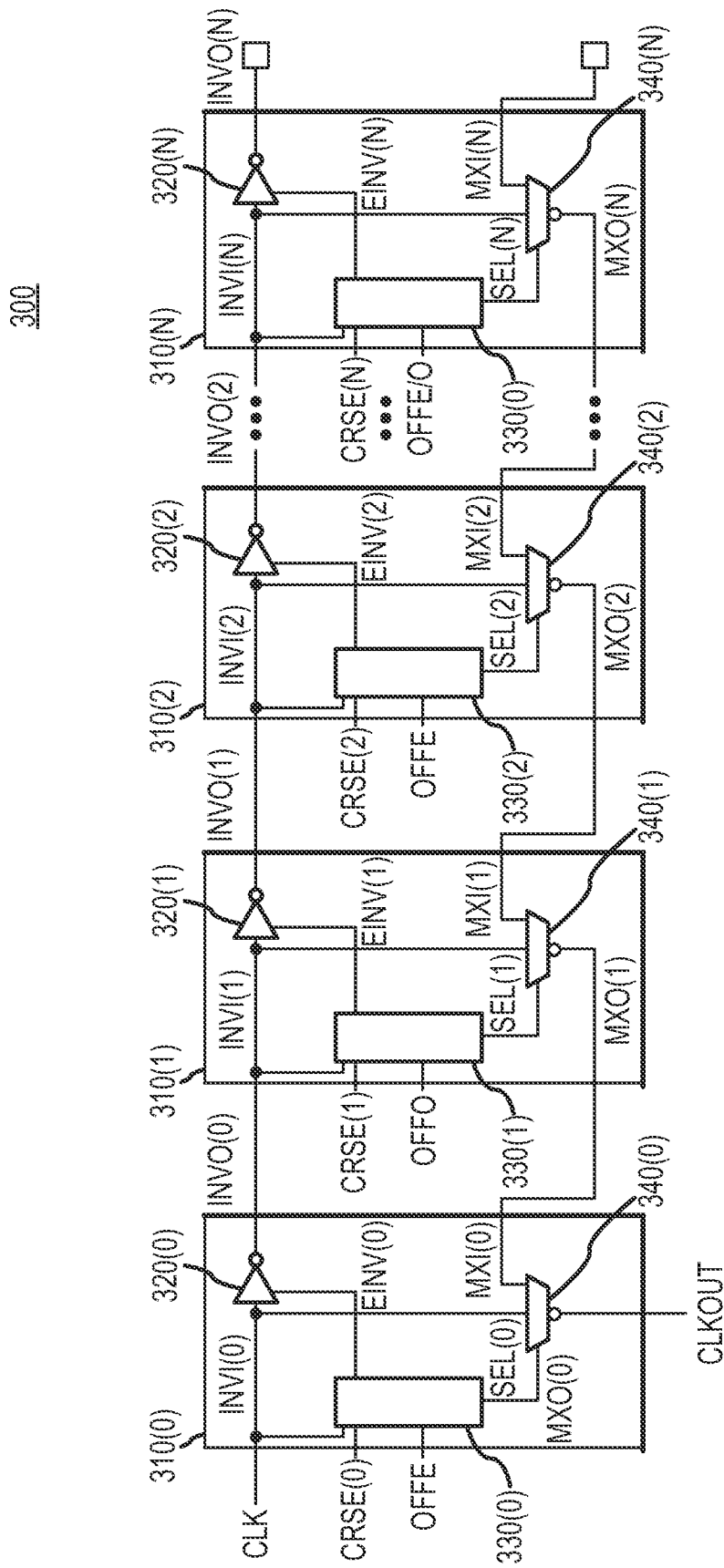
FIG. 3 is a block diagram of a particular illustrative embodiment of a coarse delay circuit having delay stages.

Referring to FIG. 3, a particular illustrative embodiment of a coarse delay circuit having delay stages 310(0-N) is disclosed and generally designated 300. The coarse delay circuit 300 may be expanded to include any number of delay stages 310(0-N). The delay stages 310(1-N) may be coupled to adjacent delay stages. The coarse delay circuit 300 may be configured to delay an input signal CLK through active delay stages of the delay stages 310(0-N) to provide an output signal CLKOUT. A number of active stages of the delay stages 310(0-N) may be adjusted based on coarse delay stage control signals CRSE(0-N) and responsive to an edge of a respective inverter input signal INVI(0-N). Timing adjustment of the number of active delay stages responsive to the edge of the respective INVI(0-N) signal may reduce a likelihood of operational delays by producing a stable CLKOUT signal during the adjustment. The delay circuit 160 of FIG. 1 may include the coarse delay circuit 300. The coarse delay circuit 300 may correspond to the coarse delay circuit 200 of FIG. 2.

Each delay stage 310(0-N) is configured to be activated or deactivated based on a respective control signal CRSE(0-N). A first delay stage 310(0) of the coarse delay circuit 300 may be configured to receive the CLK signal and to provide the CLKOUT signal having a delay through one or more of the delay stages 310(0-N). The delay stages 310(0-N-1) may be configured to provide a respective inverter output signal INVO(0-N-1) to a subsequent delay stage 310(1-N) and to receive a respective multiplexer out signal MXO(1-N) from the subsequent delay stage 310(1-N).

Each delay stage 310(0-N) may include a respective delay stage controller 330(0-N) configured to control outputs of respective inverters 320(0-N) and respective multiplexers 340(0-N). The respective delay stage controller 330(0-N) may be configured to receive the respective CRSE(0-N) signal and the respective INVI(0-N) signal. The delay stage controller 330(0-N) may be further configured to provide an enable inverter signal EINV(0-N) to the respective inverters 320(0-N) and a multiplexer select signal SEL(0-N) to the respective multiplexers 340(0-N). Values of each of the EINV(0-N) and SEL(0-N) signals are controlled based on values of the received respective CRSE(0-N) signals. Further, timing of changes in values of each of the EINV(0-N) and SEL(0-N) signals may be controlled responsive to an edge of the respective INVI(0-N) signal. Each of the delay stage controllers 330(0-N) may also be configured to receive one of an even offstate signal OFFE or an odd offstate signal OFFO signal to account for polarity toggling between each delay stage 310(0-N).

Each respective inverter 320(0-N) may be configured to receive the respective INVI(0-N) signal, and to provide the respective INVO(0-N) signal to a subsequent delay stage 310(1-N). The INVO(0-N) signal is provided to a subsequent delay stage of the delay stages 310(1-N) for input into the respective inverter 320(1-N). A value of the respective INVO(0-N) signal may be based on a value of the EINV(0-N) signal. For example, the inverter 320(0-N) provides the respective INVO(0-N) signal having a value complementary to a value of the respective INVI(0-N) signal responsive to the EINV(0-N) signal being asserted. In other embodiments, the inverter 320(0-N) provides the INVO(0-N) signal having a logical high value responsive to the EINV(0-N) signal being de-asserted. In an embodiment, the inverters 320(0-N) are tri-state inverters.

The respective multiplexers 340(0-N) may be configured to receive the INVI(0-N) signal at a first input and a multiplexer input signal MXI(0-N) at a second input, and to provide, at an output, a multiplexer output signal MXO(0-N) having a value of one of the respective INVI(0-N) signal and the respective MXI(0-N) signal based on a value of the respective SEL(0-N) signal. For example, the respective MXO(0-N) signal may have a value of the respective INVI(0-N) signal responsive to the SEL(0-N) signal being de-asserted. Further, the respective MXO(0-N) signal has a value of the respective MXI(0-N) signal responsive to the SEL(0-N) signal being asserted. In an embodiment, the respective MXO(0-N-1) signal may have a value of the respective MXI(1-N) signal received from a subsequent delay stage 310(1-N).

During operation, as explained with reference to FIG. 2, one or more of the respective CRSE(0-N) signals may be asserted to activate associated delay stages of the delay stages 310(0-N) to adjust a delay applied to the CLK signal to provide the CLKOUT signal. The activated delay stages 310(0-N) may form a delay path through the coarse delay circuit 300. Based on the asserted CRSE(0-N) signals, the respective delay stage controller 330(0-N) may be configured to assert the respective EINV(0-N) and SEL(0-N) signals responsive to an edge of the respective INVI(0-N) signals. The timing related to asserting the respective EINV(0-N) and SEL(0-N) signals is explained further with reference to FIG. 4.

Responsive to the EINV(0-N) signal being asserted, the respective inverter 320(0-N) may be configured to provide the INVO(0-N) signal having a value that is complementary to a value of the INVI(0-N) signal at an output. Thus, for each CRSE(0-N) signal that is asserted, the respective EINV(0-N) is asserted and, responsive to the asserted EINV(0-N) signal, the respective inverters 320(0-N) may be configured to provide the INVO(0-N) signal having a complementary value of the INVI(0-N) signal at an output.

As explained above, a value of the respective MXO(0-N) signal output from the multiplexers 340(0-N) is based on a value of the SEL(0-N) signal. Thus, responsive to the SEL(0-N) signal being de-asserted, the respective multiplexers 340(0-N) may be configured to provide the respective MXO(0-N) signal having a value of the respective INVI(0-N) signal. Further, responsive to the SEL(0-N) signal being asserted, the respective multiplexers 340(0-N) may be configured to provide the respective MXO(0-N) signal having a value of the respective MXI(0-N) signal.

The combination of the inverters 320(0-N) and the multiplexers 340(0-N) form a looped delay path through the coarse delay circuit 300 starting from the CLK signal input of the first delay stage 310(0), with a forward delay path passing through each inverter 320(0-N) receiving an asserted EINV(0-N) signal and a feedback delay path through the multiplexers 340(0-N) starting with the first respective multiplexer 340(0-N) receiving the respective SEL(0-N) signal having a de-asserted value (e.g., at the first deactivated delay stage of the delay stages 310(0-N)) and ending at an output of the multiplexer 340(0) of the first delay stage 310(0).

As explained above with reference to FIG. 2, as relative timing between signals changes, adjustment of the delay applied to the CLK signal may be required, e.g., a delay through the coarse delay circuit 300 may need to be increased or decreased by increasing the number of active delay stages of the delay stages 310(0-N) and decreasing the number of active delay stages, respectively.

As explained above, the delay stage controller 330(0-N) of each delay stage 310(0-N) is configured to control a transition of the respective delay stage 310(0-N) from inactive to active based on a value of the respective CRSE(0-N) signal, with timing of the transition responsive to an edge of the respective INVI(0-N) signal. For example, the CRSE(0-N) signal associated with a first deactivated delay stage of the delay stages 310(0-N) may be asserted to activate the first deactivated delay stage. Based on the CRSE(0-N) signal being asserted, the respective delay stage controller 330(0-N) may be configured to initiate assertion of the respective SEL(0-N) and EINV(0-N) signals responsive to a rising edge of the respective INVI(0-N) signal. Relative timing of completing assertion of the respective SEL(0-N) and EINV(0-N) signals will be described further with reference to FIGS. 3 and 4. Responsive to the respective SEL(0-N) signal being asserted, the respective multiplexers 340(0-N) may be configured to provide the respective MXO(0-N) signal having a value of the respective MXI(0-N) signal to a preceding delay stage 310(0-N-1). Responsive to the respective EINV(0-N) signal being asserted, the respective inverter 320(0-N) may be configured to provide the respective INVO(0-N) signal having a value of the respective INVI(0-N) signal to a subsequent stage 310(1-N). Thus, activating an additional inverter 320(0-N) and providing feedback through an additional multiplexers 340(0-N) increases a delay applied to the CLK signal.

Further, a respective CRSE(0-N) signal associated with a last active delay stage of the delay stages 310(0-N) may be de-asserted to deactivate the last active delay stage. Based on the respective CRSE(0-N) signal being de-asserted, the respective delay stage controller 330(0-N) may be configured to initiate de-assertion of the respective SEL(0-N) and the respective EINV(0-N) signals responsive to a rising edge of the respective INVI(0-N) signal. Relative timing of completing de-assertion of the respective SEL(0-N) signal and the respective EINV(0-N) signal will be described further with reference to FIGS. 3 and 4. Responsive to the respective SEL(0-N) signal being de-asserted, the respective multiplexers 340(0-N) may be configured to provide the respective MXO(0-N) signal having a value of the respective INVI(0-N) signal to a preceding delay stage 310(0-N-1). Responsive to the respective EINV(0-N) signal being de-asserted, the respective inverters 320(0-N) may be configured to provide the respective INVO(0-N) signal having a logical high value to a subsequent stage 310(1-N). Thus, having one less inverter 320(0-N) and providing feedback through one less multiplexer 340(0-N) in the delay path may decrease a delay applied to the CLK signal.

As an illustrative, non-limiting example starting with only the first delay stage 310(0) being active based on the CRSE(0) signal being asserted (e.g., the delay stages 310(1-N) are deactivated based on the respective CRSE(1-N) signals being de-asserted), the first delay stage controller 330(0) is configured to assert the EINV(0) and the SEL(0) signals, while all subsequent EINV(1-N) and SEL(1-N) signals are de-asserted. In this scenario, the delay path of the CLKOUT signal is provided based on a propagation delay through the inverter 320(0), the multiplexer 340(1), and the multiplexer 340(0). If additional delay to the CLK signal is desired, the CRSE(1) signal may be asserted. Based on the CRSE(1) signal being asserted, the delay stage controller 330(1) may be configured to initiate assertion of the SEL(1) and the EINV(1) signals responsive to an edge of the INVI(1) signal, while all subsequent EINV(2-N) and SEL(2-N) signals remain de-asserted (e.g., the EINV(0) and the SEL(0) signals remain asserted based on the CRSE(0) signal remaining asserted). In this scenario, responsive to the EINV(1) and the SEL(1) signals being asserted, the delay path of the CLKOUT signal is provided based on a propagation delay through the inverter 320(0), the inverter 320(1), the multiplexer 340(2), the multiplexer 340(1), and the multiplexer 340(0).

The relative timing for changing a value of each of the EINV(0-N) and SEL(0-N) signals, which effect the activation of respective delay stages 310(0-N) to increase or decrease a delay, respectively, may be based on the rising edge of the respective INVI(0-N) signal, as will be described further with reference to FIG. 4.

Figure 4:
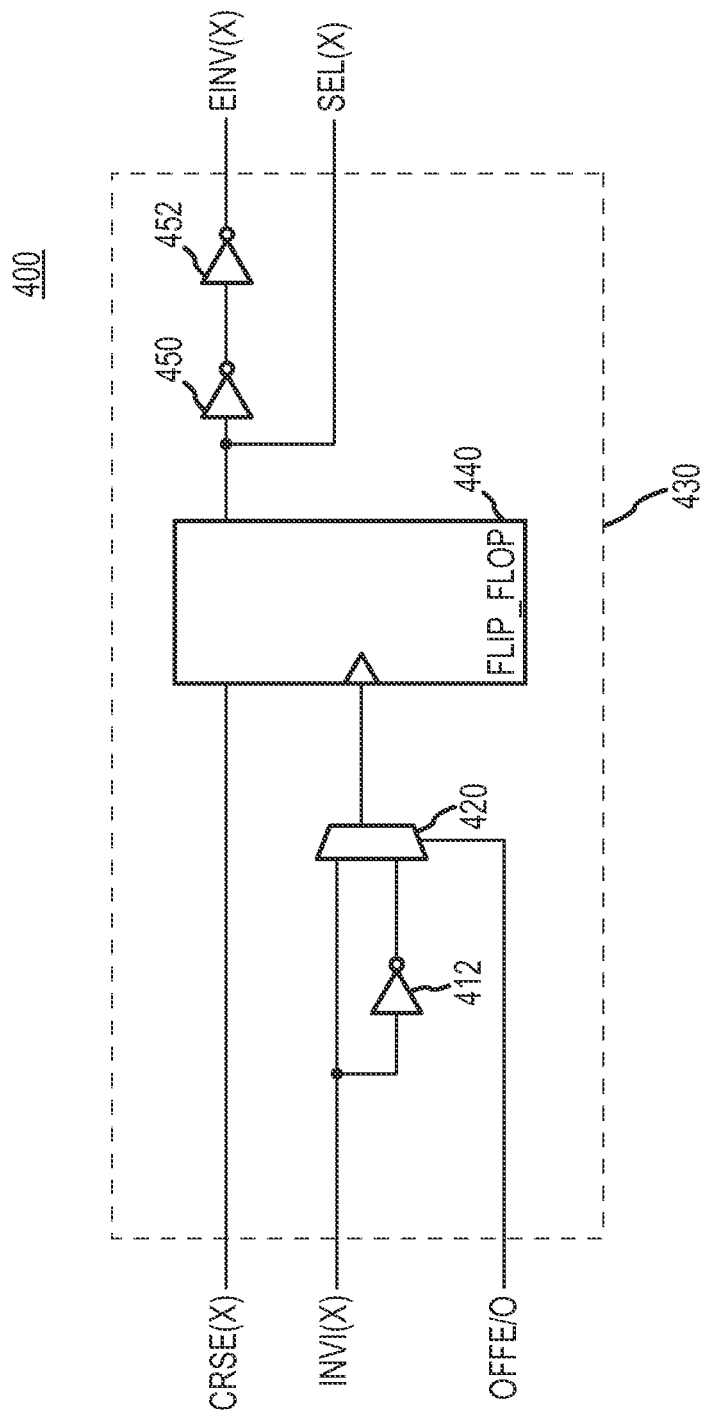
FIG. 4 is a block diagram of a particular illustrative embodiment of an apparatus including a delay stage controller.

Referring to FIG. 4, a particular illustrative embodiment of an apparatus including a delay stage controller 430 is disclosed and generally designated 400. The delay stage controller 430 may be configured to control setting of the inverter enable signal EINV(X) and the multiplexer select signal SEL(X) based on a coarse delay stage control signal CRSE(X). The delay stage controller 430 may include a flip-flop 440 configured to receive the CRSE(X) signal and provide the CRSE(X) signal to an output responsive to an inverter input signal INVI(X). The delay stage controller 430 may correspond to a single delay stage controller of the delay stage controllers 330(0-N) of the delay stages 310(0-N) of FIG. 3.

In operation, the INVI(X) signal is split between an input to input inverter 412 and a first input to a multiplexer 420. An output of input inverter 412 is provided to a second input to the multiplexer 420. An output of the multiplexer 420 is controlled by an even offstate signal OFFE or an odd offstate signal OFFO, depending on the respective delay stage. Because the polarity of the INVI(X) signal toggles between each delay stage, the OFFE and OFFO signals, along with the multiplexer 420 and the input inverter 412, ensure that a correct polarity is used to toggle the flip-flop 440 at the correct time. Thus, when the OFFE signal is received at the multiplexer 420, the output has a value of the first input, and when the OFFO signal is received at the multiplexer 420, the output has a value of the second input. The output of the multiplexer 420 is provided to an input of the flip-flop 440 to control provision of the CRSE(X) signal. The flip-flop 440 is configured to provide, at an output, the CRSE(X) signal responsive to a rising edge of the output of the multiplexer 420 (e.g., the output of the multiplexer 420 is based on the INVI(X) signal). The SEL(X) signal has a value of the CRSE(X) signal provided from the output of the flip-flop 440. The CRSE(X) signal at the output of the flip-flop 440 is also provided to an input of a pair of output inverters 450 and 452 coupled in series. The pair of output inverters 450 and 452 provide the CRSE(X) signal to an output that provides the EINV(X) signal. Thus, a transition of the EINV(X) signal is delayed with respect to transition of the SEL(X) signal by a delay associated with the pair of output inverters 450 and 452. Timing of the transition of the SEL(X) and the EINV(X) signals is described further with reference to FIG. 5.

Figure 5:
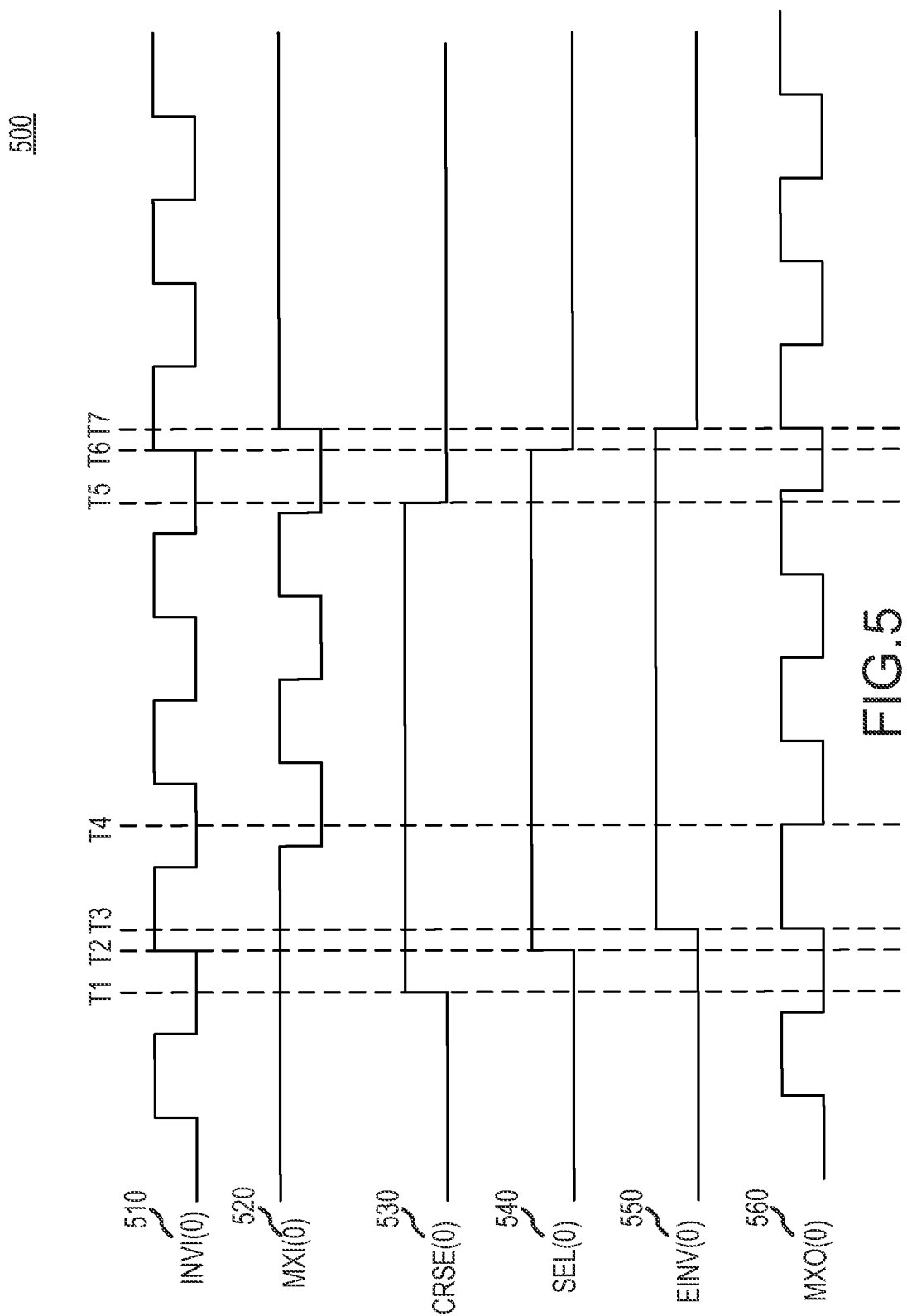
FIG. 5 is an exemplary timing diagram of a particular illustrative embodiment of activating and deactivating a delay stage of a coarse delay circuit.

Referring to FIG. 5, an exemplary timing diagram of a particular illustrative embodiment of adjusting a delay of a coarse delay circuit is disclosed and generally designated 500. For example, the exemplary timing diagram 500 may illustrate timing characteristics of the apparatus 100 of FIG. 1, the coarse delay circuit 200 of FIG. 2, the coarse delay circuit 300 of FIG. 3, and/or the apparatus 400 of FIG. 4. The timing diagram 500 depicts exemplary timing associated with activating an additional delay stage and deactivating an active delay stage. An inverter input signal INVI(0) 510 may correspond to the INVI(0) signal of FIG. 3, and/or the INVI(X) signal of FIG. 4. A multiplexer input signal MXI(0) 520 may correspond to the MXI(0) signal of FIG. 3. A coarse delay stage control signal CRSE(0) 530 may correspond to the CRSE(0) signal of FIG. 3 and/or the CRSE(X) signal of FIG. 4. A multiplexer select signal SEL(0) 540 and an inverter enable signal EINV(0) 550 may correspond to the SEL(0) signal and the EINV(0) signal, respectively, of FIG. 3, and/or the SEL(X) signal and the EINV(X) signal, respectively, of FIG. 4. A multiplexer output signal MXO(0) 560 may correspond to the MXO(0) signal of FIGS. 2 and/or 3.

The INVI(0) signal may be a periodic signal toggling between a logical high value and a logical low value over time. As explained with reference to FIGS. 2 and 3, the INVI(0) signal may be based on the CLK signal. Prior to time T1, the CRSE(0) signal is de-asserted, and accordingly, the SEL(0), and EINV(0) signals are de-asserted. Responsive to the SEL(0) signal being de-asserted, a multiplexer, such as the multiplexers 340(0) of FIG. 3, may be configured to provide the MXO(0) signal having a value of the INVI(0) signal to an output. Responsive to the EINV(0) signal being de-asserted, an inverter, such as the inverter 320(0) of FIG. 3, may be configured to provide the respective INVO(0-N) signal having a logical high value to a second multiplexer of a subsequent delay stage, which may be configured to propagate the logical high value to the multiplexer as the MXI(0) signal. The exemplary timing diagram 500 depicts activation of a delay stage, such as the delay stage 210(0) of FIG. 2 or the delay stage 310(0) of FIG. 3 between time T1 and time T4, and deactivation of the delay stage between time T5 and time T8.

At time T1, the CRSE(0) signal is asserted. The EINV(0) and SEL(0) signals remain de-asserted between time T1 and time T2. At time T2, an edge of the INVI(0) signal initiates a transition of the SEL(0) signal to being asserted, e.g., via a flip-flop such as the flip-flop 440 of FIG. 4. Responsive to the SEL(0) signal being asserted, the multiplexer may be configured to provide the MXO(0) signal having a value of the MXI(0) signal.

At time T3, the EINV(0) signal is asserted. A delay between transition of the SEL(0) signal at time T2 and transition of the EINV(0) signal at time T3 may be based on delay gates, such as the output inverters 450 and 452 of FIG. 4. Responsive to the EINV(0) signal being asserted, an inverter, such as the inverters 320(0) of FIG. 3, may be configured to provide the INVI(0) signal to a subsequent delay stage, such as the 210(1) of FIG. 2 or the 310(1) of FIG. 3. A second multiplexer of the subsequent stage, such as the multiplexers 340(1) of FIG. 3, is configured to provide the received INVI(0) signal to the multiplexer of the first delay stage, with the MXI(0) signal having a value of the propagated INVI(0) signal. Timing of the MXI(0) signal may be delayed relative to timing of the INVI(0) signal based on propagation through the inverter and the second multiplexer. Based on the activation of the delay stage, the MXO(0) signal may be shifted to the right by a time equal to a delay time between the INVI(0) signal and the MXI(0) signal. The delay stage is activated such that the MXI(0) signal is held at the logical high value between T3 and T4 by an additional time equal to the time shift to the right.

At time T5, the CRSE(0) signal is de-asserted. At time T6, an edge of the INVI(0) signal may initiate de-assertion of the SEL(0) signal and the EINV(0) signal. Thus, at time T6, the SEL(0) signal is de-asserted, and responsive to the SEL(0) signal being de-asserted, the multiplexer may be configured to provide the MXO(0) signal having a value of the INVI(0) signal. Based on the activation of the delay stage, the MXO(0) signal may be shifted to the left by a time equal to a delay time between the INVI(0) signal and the MXI(0) signal, and the delay stage is deactivated. Thus, the logical loss value of the MXO(0) signal ending at time T7 is reduced by a time equal to the time shift to the left. At time T7, a rising edge of the MXI(0) signal is provided at an output of the multiplexer as MXO(0) signal.

Further, at time T7, the EINV(0) signal is de-asserted. Responsive to the EINV(0) signal being de-asserted, the inverter may be configured to provide the INVI(0) signal having a logical high value to the subsequent delay stage.

Responsive to the inverter providing the logical high value, the second multiplexer is configured to propagate the received logical high value signal and the MXI(0) signal transitions to the propagated logical high at time T7.

The exemplary timing diagram 500 is a non-limiting illustration to provide a sufficient understanding of embodiments of the disclosure. Those of ordinary skill in the art will appreciate that the relative timing of the signals of the exemplary timing diagram 500 may vary from system to system. For example, a time shift to the left or the right when activating or deactivating, respectively, a delay stage may be more or less than the time shift depicted.

Figure 6:
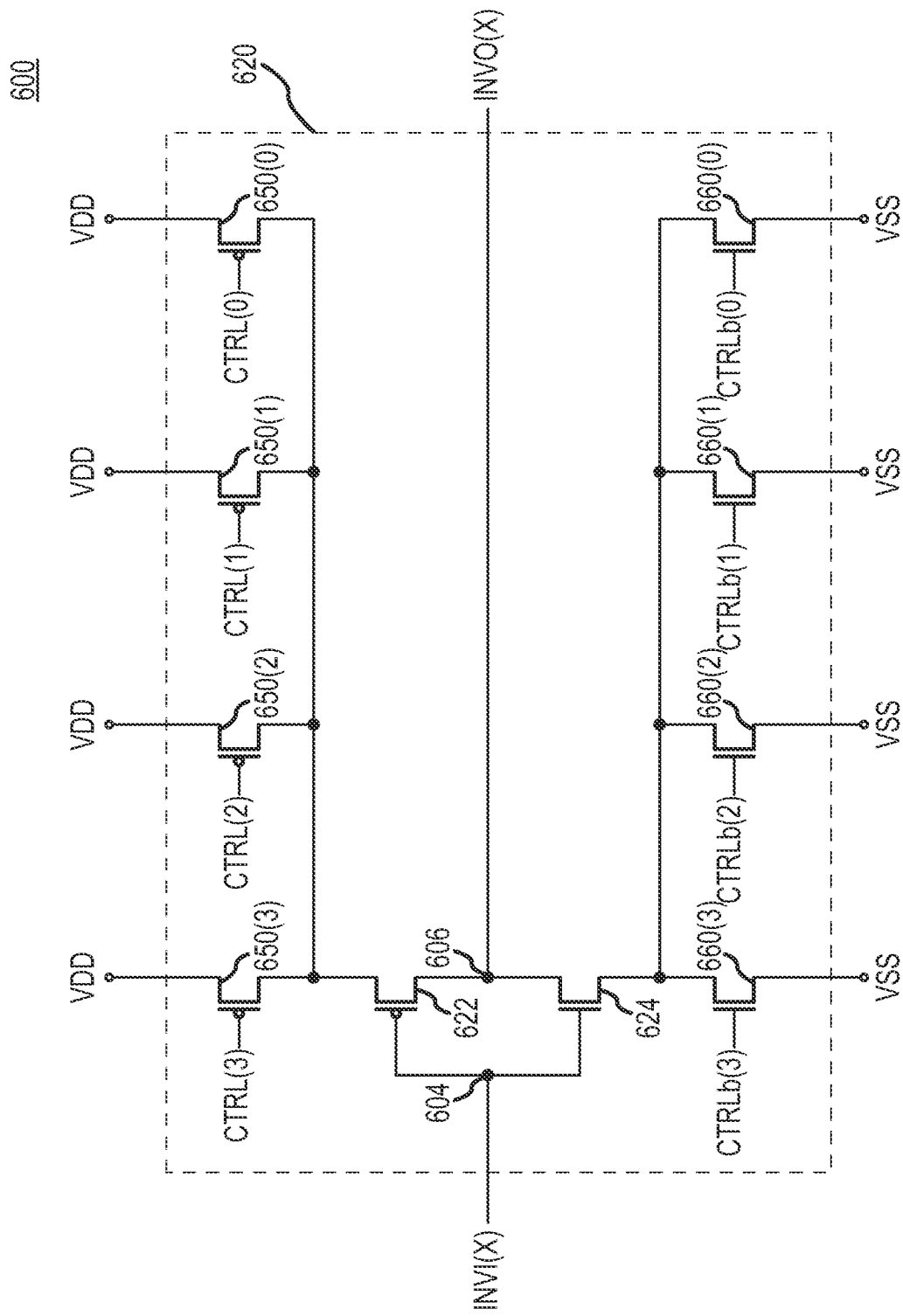
FIG. 6 is a block diagram of a particular illustrative embodiment of an apparatus including an inverter.

Referring to FIG. 6, a particular illustrative embodiment of an apparatus including an inverter 620 having configurable drive strength is disclosed and generally designated 600. The inverter 620 may be configured to receive an inverter input signal INVI(X) at a gate of each of a PMOS transistor 622 and a NMOS transistor 624 (e.g., an input node 604) and to provide an inverter output signal INVO(X) at an output node 606 coupled to the drains of each of the PMOS transistor 622 and the NMOS transistor 624. The inverter 620 may include any of the inverters 320(0-N) of FIG. 3.

The inverter 620 may further include pull-up transistors 650(0-3) having a drain coupled to a source of the PMOS transistor 622. Each of the pull-up transistors 650(0-3) may be configured to receive a respective control signal CTRL(0-3) at a respective gate and a VDD voltage at a respective source. Each pull-up transistors 650(0-3) may be configured to provide the VDD voltage to the source of the PMOS transistor 622 based on a value of the respective CTRL(0-3) signal.

The inverter 620 may further include pull-down transistors 660(0-3) having a drain coupled to a source of the NMOS transistor 624. Each of the pull-down transistors 660(0-3) may be configured to receive a respective control signal complement CTRLb(0-3) at a respective gate and a VSS voltage at a respective source. Each pull-down transistors 660(0-3) may be configured to provide the VSS voltage to the source of the NMOS transistor 624 based on as value of the respective CTRLb(0-3) signal. In an embodiment, the respective CTRLb(0-3) signals are complementary to the CTRL(0-3) signals. The CTRL(0-3) and the CTRLb(0-3) signals may be provided by a controller (not shown), such as the 150 of FIG. 1. In an embodiment, the pull-up transistors 650(0-3) may be NMOS transistors and the pull-down transistors 660 (0-N) may be PMOS transistors.

In operation, one of more of the CTRL(0-3) signals may be asserted (and respective CTRLb(0-3) signals de-asserted). Responsive to the asserted CTRL(0-3) signals, the respective pull-up transistors 650(0-3) may be enabled to couple the VDD voltage to the source of the PMOS transistor 622. Accordingly, responsive to the de-asserted CTRLb(0-3) signals, the respective pull-down transistors 660(0-3) may be enabled to couple the VSS voltage to the source of the NMOS transistor 624. Responsive to a value of the INVI(X) signal received at the input node 604 having a logical low value, the enabled pull-up transistors 650(0-3) allow the output node 606 to be pulled up to the VDD voltage (e.g., a logical high value). Further, responsive to a value of the INVI(X) signal received at the input node 604 having a logical high value, the enabled pull-down transistors 660(0-3) allow the output node 606 to be pulled down to the VSS voltage (e.g., a logical low value). A number of each of the pull-up transistors 650(0-3) and the pull-down transistors 660(0-3) that are enabled may control a drive strength of the inverter 620, increasing or decreasing the amount of current that may be provided from the output node 606 in providing the INVO(X) signal. For example, as the number of the pull-up transistors 650(0-3) and the pull-down transistors 660(0-3) that are enabled increases, the drive strength of the inverter 620 increases to drive the INVO(X) signal to VDD and VSS faster, and as the count of the pull-up transistors 650(0-3) and the pull-down transistors 660(0-3) that are enabled decreases, the drive strength of the inverter 620 decreases to drive the INVO(X) signal to VDD and VSS slower. While the inverter 620 discloses four of the pull-up transistors and four pull-down transistors, the inverter 620 may include any number of pull-up and pull-down transistors.

Figure 7:
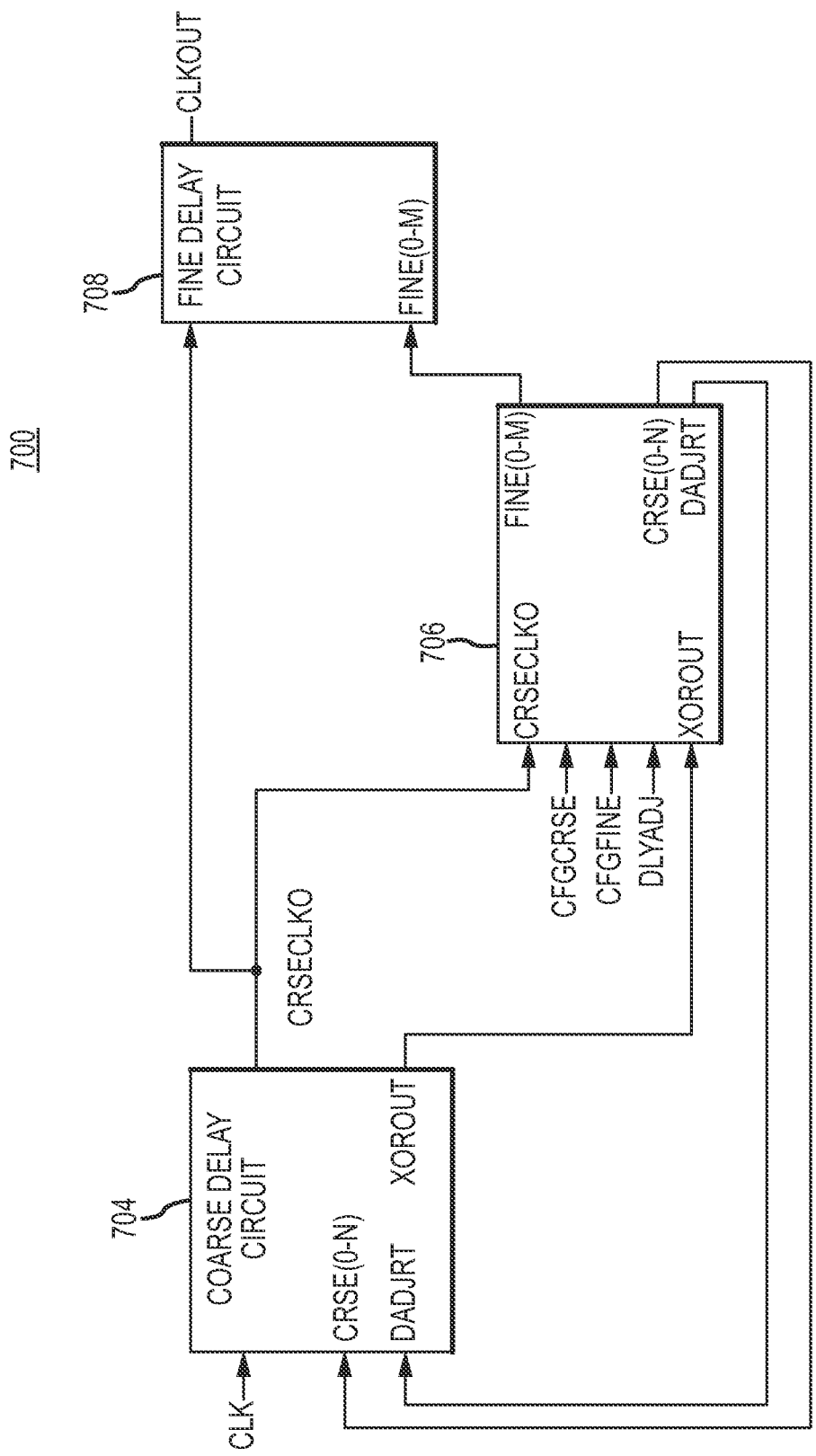
FIG. 7 is a block diagram of a particular illustrative embodiment of a delay circuit.

Referring to FIG. 7, a particular illustrative embodiment of a delay circuit is disclosed and generally designated 700. The delay circuit 700 may include a coarse delay circuit 704 configured to delay an input signal CLK and provide a coarse delay output signal CRSECLKO to a fine delay circuit 708. The fine delay circuit 708 may be configured to delay the CRSECLKO signal to provide an output signal CLKOUT. A delay circuit controller 706 may be configured to control (e.g., coordinate) timing of delay adjustments of the coarse delay circuit 704 and the fine delay circuit 708 to improve reliability of the CLKOUT signal during the adjustment time period. The delay circuit 700 may correspond to the delay circuit 160 of FIG. 1.

The delay circuit controller 706 may be configured to receive a coarse delay circuit configuration signal CFGCRSE having data defining a number of active coarse delay stages of the coarse delay circuit 704 and a fine delay configuration signal CFGFINE having data defining a fine delay of the fine delay circuit 708. The CFGCRSE signal and the CFGFINE signal may be provided from configuration registers via a controller, such as the controller 150 of FIG. 1. The delay circuit controller 706 may be further configured to receive a valid data control signal DLYADJ from a controller to initiate a delay adjustment. The fine delay circuit 708 may also be configured to base event triggers off of the CRSECLKO signal received from the coarse delay circuit 704. The delay circuit controller 706 may be further configured to receive a delay circuit synchronization output signal XOROUT. The delay circuit controller 706 may be configured to provide a data valid retimed signal DADJRT and coarse delay stage control signals CRSE(0-N) to the coarse delay circuit 704. The delay circuit controller 706 may also be configured to provide a fine delay circuit control signal FINE(0-M) to the fine delay circuit 708 responsive to the XOROUT signal.

In addition to the CLK signal, the coarse delay circuit 704 may be configured to receive the CRSE(0-N) signals to control a number of active delay stages. The coarse delay circuit 704 may also be configured to receive the DADJRT signal from the delay circuit controller 706 to initiate activation or deactivation of delay stages based on the CRSE(0-N) signals. Each delay stage of the coarse delay circuit 704 may be configured to delay the CLK signal by an approximately equal length of time (e.g., a coarse delay step). The delay circuit controller 706 may be configured to provide the CRSE (0-N) signals at an output. The coarse delay circuit 704 may also be configured to provide the XOROUT signal to the delay circuit controller 706 to coordinate adjustment of a delay through the coarse delay circuit 704 with adjustment of a delay through the fine delay circuit 708.

The fine delay circuit 708 may be configured to delay the CRSECLKO signal by a fine delay length defined by the FINE(0-M) delay signal. The fine delay circuit 708 may include delay elements that are configurable to adjust the fine delay in fine delay steps. A fine delay step has more refined resolution as compared with the coarse delay step. Accordingly, each coarse delay step is equivalent to a plurality of fine delay steps. Determining a count fine delay steps that is equivalent to a coarse delay step is described further with reference to FIG. 12.

In normal operation, the coarse delay circuit 704 and the fine delay circuit 708 work together to delay the CLK signal, with the coarse delay circuit 704 applying a coarse delay, and the fine delay circuit 708 fine-tuning the coarse delay to provide the CLKOUT signal. As additional delay is required, the fine delay circuit 708 is configured to increment the fine delay in fine delay steps. Once the total fine delay length approaches a delay length of a coarse delay step, the delay circuit 700 may activate an additional delay stage of the coarse delay circuit 704 and reset the fine delay of the fine delay circuit 708 to a near zero delay. Further, as delay reduction is required, the fine delay circuit 708 is configured to decrement the fine delay in fine delay steps. Once the total fine delay length approaches a zero delay length, the delay circuit 700 may deactivate an active delay stage of the coarse delay circuit 704 and reset the fine delay of the fine delay circuit 708 to a delay length approximately equal to the coarse delay step.

There may be a lag between a time the coarse delay circuit 704 begins to implement an adjustment to the coarse delay applied to the CLK signal, and the CRSECLKO signal having the adjusted coarse delay propagating to an output of the coarse delay circuit 704. If the fine delay circuit 708 applies the fine delay adjustment prior to receiving the adjusted CRSECLKO signal from the coarse delay circuit 704, the CLKOUT signal, based on the fine delay adjustment, will shift in one direction, and when the adjusted CRSECLKO signal reaches the fine delay circuit 708, the CLKOUT signal will shift in the opposite direction. Similarly, if the fine delay circuit 708 applies the fine delay adjustment after an existing fine delay has been applied to the adjusted CRSECLKO signal from the coarse delay circuit 704, the CLKOUT signal, based on the coarse delay adjustment, will shift in one direction prior to the fine delay adjustment being applied, and will shift in the opposite direction when the fine delay adjustment is applied. The shifting of the CLKOUT signal may cause unpredictable behavior in circuitry (not shown) using the CLKOUT signal. Accordingly, the delay circuit controller 706 may coordinate the fine delay adjustment applied by the fine delay circuit 708 with the adjusted CRSECLKO signal provided from the coarse delay circuit 704.

To effect the adjustments to the delay through the delay circuit 700, the delay circuit controller 706 may receive an updated CFGCRSE signal and an updated CFGFINE signal. The delay circuit controller 706 may decode CFGCRSE signal to generate the CRSE(0-N) signals, and provide the CRSE (0-N) signals to the coarse delay circuit 704. The delay circuit controller 706 may also receive the DLYADJ signal, and retime the DLYADJ signal to correspond with timing of the CRSECLKO signal to provide the DADJRT to the coarse delay circuit 704. Operation of the delay circuit controller 706 will be described further with reference to FIG. 10.

The coarse delay circuit 704 may adjust the coarse delay applied to the CLK signal based on the CRSE(0-N) and the DADJRT signals to provide the CRSECLKO signal to the fine delay circuit 708, such as by activating a deactivated delay stage or deactivating an active delay stage. Operation of the coarse delay circuit 704 will be described further with reference to FIGS. 8 and 9. Additionally, the fine delay circuit 708 may further delay the CRSECLKO signal based on the FINE signal received from the delay circuit controller 706 to provide the CLKOUT signal. The delay circuit controller 706 may delay provision of the updated FINE(0-M) signal to the fine delay circuit 708 until the adjustment to the coarse delay has been applied to the CLK signal, and the adjusted CRSE- CLKO signal has been provided at an output of the coarse delay circuit 704, which will be described further with reference to FIG. 10.

Figure 8:
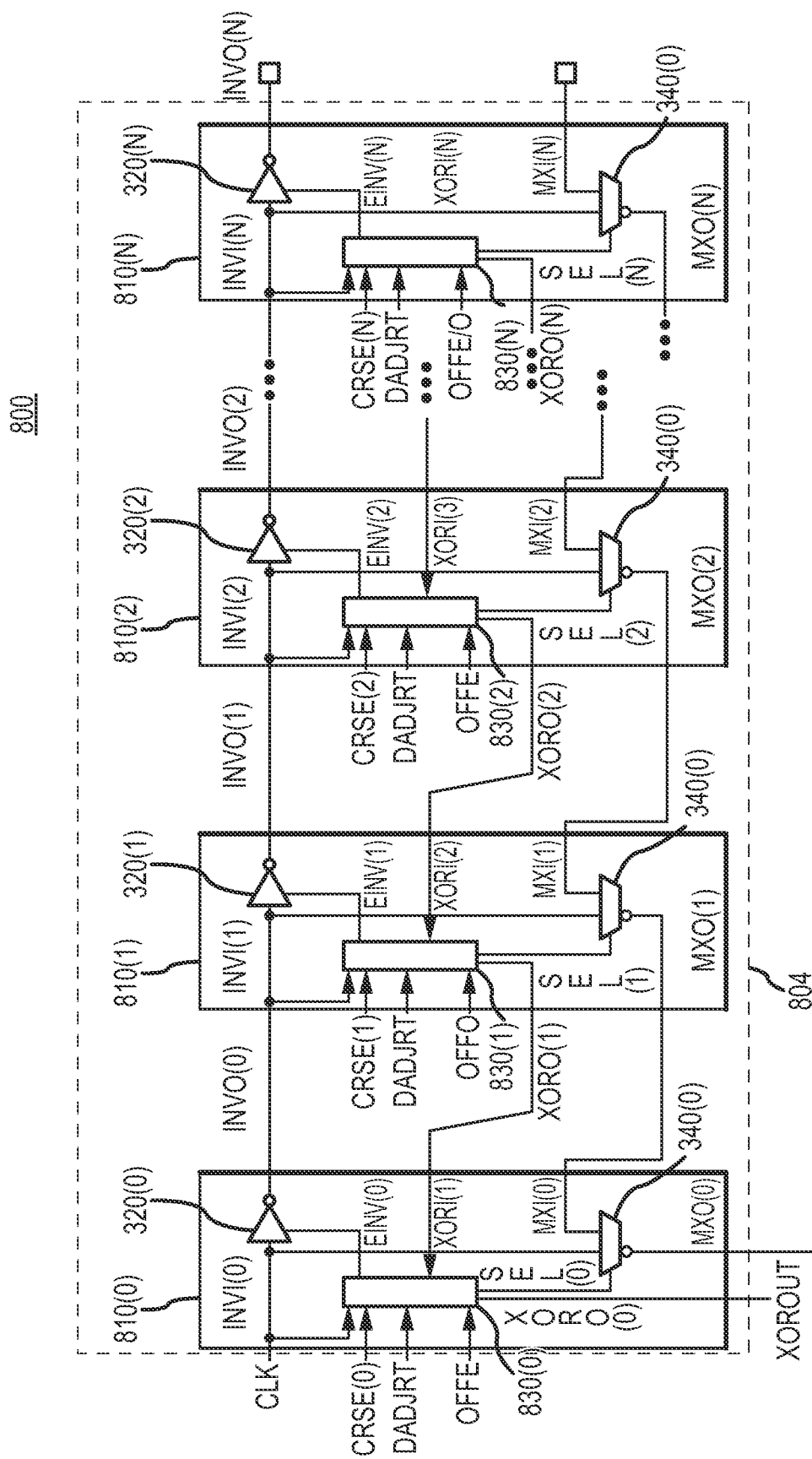
FIG. 8 is a block diagram of a particular illustrative embodiment of a coarse delay circuit having delay stages.

Referring to FIG. 8, a particular illustrative embodiment of a coarse delay circuit 804 having delay stages 810(0-N) is disclosed and generally designated 800. The coarse delay circuit 804 may be expanded to include any number of delay stages 810(0-N). The delay stages 810(1-N) may be coupled to adjacent delay stages. The coarse delay circuit 804 may be configured to delay in input signal CLK through active delay stages of the delay stages 810(0-N) to provide a coarse delay output signal CRSECLKO. In an embodiment, the delay stages 810(1-N) may have the same architecture. A number of active stages of the delay stages 810(0-N) may be dynamically adjusted based on coarse delay stage control signals CRSE(0-N). The delay circuit 160 of FIG. 1 and/or the coarse delay circuit 704 of FIG. 7 may include the coarse delay circuit 804 of FIG. 8.

The coarse delay circuit 804 includes elements that have been previously described with respect to the coarse delay circuit 300 of FIG. 3. Those elements have been shown in FIG. 8 using the same reference numbers used in FIG. 3, and operation of the common elements is as previously described. Consequently, a detailed description of the operation of these elements will not be repeated in the interest of brevity.

Each delay stage 810(0-N) is configured to be activated or deactivated based on the respective CRSE(0-N) signal. A first delay stage 810(0) of the coarse delay circuit 804 may be configured to receive the CLK signal and to provide the CRSECLKO signal having a delay through one or more active delay stages of the delay stages 810(0-N). The coarse delay circuit 804 may be further configured to provide a delay circuit synchronization output signal XOROUT to synchronize output of an adjusted CRSECLKO signal with further adjustment by a fine delay circuit, such as the fine delay circuit 708 of FIG. 7. Each delay stage 810(0-N-1) may be configured to provide a respective inverter output signal INVO(0-N-1) to a subsequent delay stage of the delay stages 810(1-N) and to receive a respective multiplexer out signal MXO(1-N) from the subsequent delay stage 810(1-N).

Each delay stage 810(0-N) may include a respective delay stage controller 830(0-N) coupled to a respective inverters 320(0-N) and a respective multiplexers 340(0-N). The 830(0-N) may be configured to receive the respective CRSE(0-N) signal, a retimed data valid control signal DADJRT, and a inverter input signal INVI(0-N). The respective delay stage controller 830(0-N) is further configured to provide an enable inverter signal EINV(0-N) to the respective inverter 320(0-N) and a multiplexer select signal SEL(0-N) to the respective multiplexer 340(0-N). Values of each of the EINV(0-N) and SEL(0-N) signals are controlled based on a value of the received CRSE(0-N) signal responsive to the DADJRT signal and further responsive to the respective INVI(0-N) signal. Each respective delay stage controller 830(0-N) may also be configured to receive an even offstate signal OFFE or an odd offstate signal OFFO signal to account for polarity toggling between each delay stage 810(0-N).

Additionally, each respective delay stage controller 830(0-N) may receive a respective adjustment synchronization input signal XORI(0-N) and provide a respective adjustment synchronization output signal XORO(0-N). Control of the respective XORI(0-N) and the respective XORO(0-N) signals will be described further with reference to FIG. 9.

In operation, as explained above with reference to FIGS. 2 and 3, the combination of the enabled inverters 320(0-N) and the multiplexers 340(0-N) form a delay path through the coarse delay circuit 804. As relative timing between signals changes, adjustment of the delay applied to the CLK signal may be required, e.g., a delay through the coarse delay circuit 804 may need to be increased or decreased, which may be effected by increasing or decreasing the number of active delay stages 810(0-N), respectively.

For example, in an activation of a delay stage, the respective CRSE(0-N) signal associated with a first deactivated delay stage of the delay stages 810(0-N) may be asserted to activate the first deactivated delay stage 810(0-N). The respective delay stage controller 830(0-N) may be configured activate the first delay stage by initiating provision of the respective asserted CRSE(0-N) signal through the respective delay stage controller 830(0-N) responsive to the DADJRT signal. The respective delay stage controller 830(0-N) may be configured to assert the respective SEL(0-N) and the respective EINV(0-N) signals based on the provided asserted CRSE(0-N) signal and responsive to one or more edges of the respective INVI(0-N) signal. Relative timing of completing assertion of the respective SEL(0-N) signal and the respective EINV(0-N) signal will be described further with reference to FIGS. 9 and 10. As explained with reference to FIG. 3, responsive to the respective SEL(0-N) signal being asserted, the respective multiplexers 340(0-N) may be configured to provide the respective MXO(0-N) signal having a value of the respective MXO(0-N) signal to a preceding delay stage 310(0-N-1). Further, responsive to the respective EINV(0-N) signal being asserted, the respective inverters 320(0-N) may be configured to provide the respective INVO(0-N) signal having a value that is complementary to a value of the respective INVI(0-N) signal to a subsequent stage 810(1-N). Thus, activating an additional inverters 320(0-N) and providing feedback through an additional multiplexers 340(0-N) increase a delay applied to the CLK signal.

Additionally, the respective delay stage controller 830(0-N) associated with the last deactivated stage may be configured to generate a pulse on the respective XORO(0-N) signal having a length corresponding to a delay between provision of the respective asserted CRSE(0-N) signal responsive to the DADJRT signal and asserting the respective SEL(0-N) signal. The pulse on the respective XORO(1-N) signal is provided to a preceding delay stage 810(0-N) as the respective XORI(0-N-1) signal. The pulse is provided through the respective delay stage controller 830(0-N) of each preceding active delay stage 810(0-N) and is output from the first delay stage 810(0) as the XOROUT signal. As explained with reference to FIG. 3, the delay path of the CLK signal includes a feedback delay path. From the first deactivated delay stage 810(0-N) corresponding to the respective asserted CRSE(0-N) signal, the pulse of the XORO(0-N) signal follows a synchronization delay path to an output of the first delay stage 810(0) that may have a delay similar to a delay of the feedback path. Thus, a falling edge of the pulse of the XOROUT signal may be output at approximately the same time as the CRSECLKO signal having an adjusted delay corresponding to activation of the first deactivated delay stage.

Operation of the coarse delay circuit may be similar for deactivation of an active delay stage 810(0-N). For example, as respective CRSE(0-N) signal associated with a last active delay stage of the delay stages 810(0-N) may be de-asserted to deactivate the last active delay stage 810(0-N). Based on the respective CRSE(0-N) signal being de-asserted, the respective delay stage controller 830(0-N) may be configured initiated deactivation of the active delay stage by initiating provision of the de-asserted CRSE(0-N) signal through the respective delay stage controller 830(0-N) responsive to the DADJRT signal. The respective delay stage controller 830(0-N) may be configured to de-assert the respective SEL(0-N)

and the respective EINV(0-N) signals based on the provided de-asserted CRSE(0-N) signal responsive to one or more edges of the respective INVI(0-N) signal. As explained with reference to FIG. 3, responsive to the respective SEL(0-N) signal being de-asserted, the respective multiplexers 340(0-N) may be configured to provide the respective MXO(0-N) signal having a value of the respective INVI(0-N) signal to a preceding delay stage 810(0-N-1). Further, responsive to the respective EINV(0-N) signal being de-asserted, the respective inverters 320(0-N) may be configured to provide the respective INVO(0-N) signal having a logical high value to a subsequent stage 810(1-N). Thus, providing feedback through one less inverter 320(0-N) and one less multiplexer 340(0-N) may decrease a delay applied to the CLK signal. The respective delay stage controller 830(0-N) corresponding to the deactivated delay stage 810(0-N) may also be configured to generate the pulse on the respective XORO(0-N) signal and provide the pulse to the XOROUT signal output from the first delay stage 810(0) contemporaneous with the adjusted CRSECLKO signal.

Figure 9:
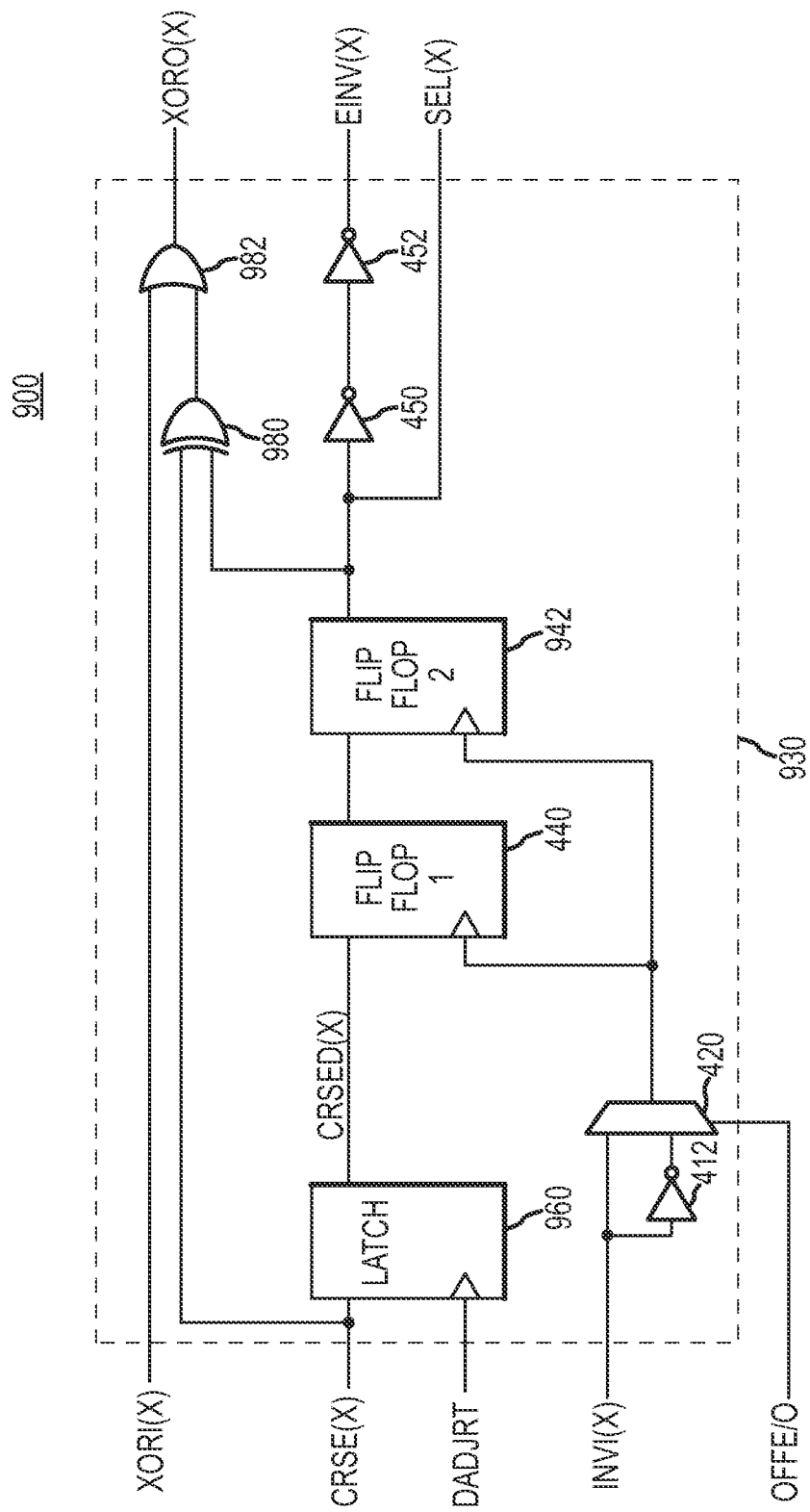
FIG. 9 is a block diagram of a particular illustrative embodiment of an apparatus including a delay stage controller.

Referring to FIG. 9, a particular illustrative embodiment of an apparatus including a delay stage controller 930 is disclosed and generally designated 900. The delay stage controller 930 may be configured control setting of the inverter enable EINV(X), the multiplexer select SEL(X), and the adjustment synchronization output signal XORO(X) signals. The delay stage controller 930 may correspond to a single one of the delay stage controller 830(0-N) of FIG. 8.

The delay stage controller 930 includes elements that have been previously described with respect to the 430 of FIG. 4. Those elements have been shown in FIG. 9 using the same reference numbers used in FIG. 4, and operation of the common elements is as previously described. Consequently, a detailed description of the operation of these elements will not be repeated in the interest of brevity.

The delay stage controller 930 may include a latch 960 configured to receive the CRSE(X) signal and provide the CRSE(X) signal to an output responsive to a retimed data valid control signal DADJRT to provide a delayed coarse delay stage control signal CRSED(X). The 930 may further include a pair of flip-flops 440 and 942 coupled in series configured to sequentially provide the CRSED(X) signal received from the latch 960 to an output of the flip-flop 942 responsive to one or more edges of an inverter input signal INVI(X) signal.

The delay stage controller 930 further includes an exclusive OR gate 980 having an output coupled to a first input of an OR gate 982. The exclusive OR gate 980 is configured to receive the CRSE(X) signal at a first input and a multiplexer select signal SEL(X) at a second input. The OR gate 982 is configured to receive an adjustment synchronization input signal XORI(X) at a second input and to provide an adjustment synchronization output signal XORO(X).

In operation, when the delay stage controller 930 is included in a delay stage being activated or deactivated, an updated value of the CRSE(X) signal may be received at the delay stage controller 930. The updated CRSE(X) signal is provided through the latch 960 responsive to the DLYADJ signal to provide an updated CRSED(X) signal. As explained with reference to FIG. 4, the output of the multiplexer 420 is provided to the flip-flop 440 to control provision of the updated CRSED(X) signal received from the latch 960. The output of the multiplexer 420 may also be provided to the flip-flop 942 to control provision of the updated CRSED(X) signal received from the flip-flop 440. The flip-flop 942 is configured to provide an updated SEL(X) signal having a value of the updated CRSE(X) signal responsive to a rising edge of the output of the multiplexer 420. As explained with reference to FIG. 4, the updated SEL(X) signal is provided to a pair of serially coupled output inverters 450 and 452, and an updated EINV(X) signal is received from the output inverter 452.

Further, when the delay stage controller 930 is included in the delay stage being activated or deactivated, the exclusive OR gate 980 initially provides a logical high output to the OR gate 982 responsive to the updated CRSE(X) signal (e.g., a value of the updated CRSE(X) signal is different than a value of a non-updated SEL(X) signal). Responsive to the SEL(X) signal being updated, the exclusive OR gate 980 provides a logical low output to the OR gate 982 (e.g., the value of the updated CRSE(X) signal matches the value of the updated SEL(X) signal). Thus, the output of the exclusive OR gate provides a logical high pulse having a length equal to a delay between receiving the updated CRSE(X) signal updating the SEL(X) signal from the output of the flip-flop 942. The pair of flip-flops 440 and 942 ensure the pulse length of the XOROUT signal is recognized by a delay circuit controller, such as the delay circuit controller 706 of FIG. 7.

When the delay stage controller 930 is included in a delay stage that precedes the delay stage being activated or deactivated, the pulse described with reference to the XORO(X) signal above is received as the XORI(X) signal at the preceding stage. The OR gate 980 receives the XORI(X) signal having the pulse and provides the pulse directly to the XORO(X) signal. Timing of transition of the SEL(X), the EINV(X), and the XORO(X) signals is described further with reference to FIG. 11.

Figure 10:
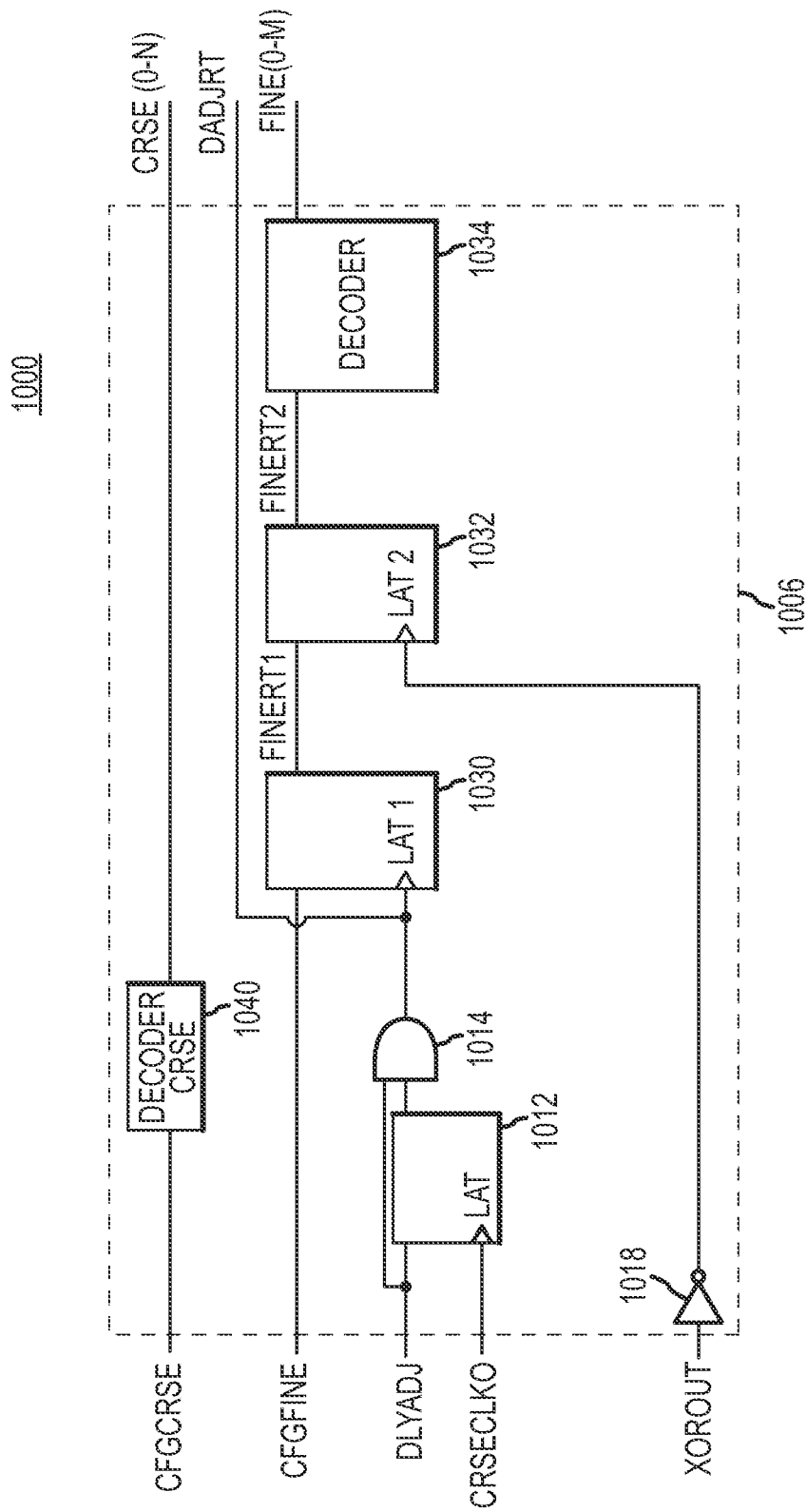
FIG. 10 is a block diagram of a particular illustrative embodiment of an apparatus including delay circuit controller.

Referring to FIG. 10, a particular illustrative embodiment of an apparatus including delay circuit controller 1006 is disclosed and generally designated 1000. The delay circuit controller 1006 may be configured control provide coarse delay stage control signals CRSE(0-N) to a coarse delay circuit, such as the coarse delay circuit 704 of FIG. 7, and to provide fine control signals FINE(0-M) to a fine delay circuit, such as the fine delay circuit 708 of FIG. 7. The delay circuit controller 1006 may include the delay circuit controller 706 of FIG. 7.

The delay circuit controller 1006 may include a decoder 1040 configured to receive and decode a coarse delay circuit configuration signal CFGCRSE, and to provide the CRSE(0-N) signals at an output. The CFGCRSE signal may include data that defines the coarse delay through the coarse delay circuit, such as the coarse delay circuit 704 of FIG. 7 and/or the coarse delay circuit 804 of FIG. 8.

The delay circuit controller 1006 may be further include a latch 1012 configured to receive a valid data control signal DLYADJ. The latch 1012 may be coupled to an coarse clock output signal CRSECLKO at a clocking input. The latch 1012 may be configured to provide the DLYADJ to an output responsive to an edge of the CRSECLKO signal. The latch 1012 may be configured to provide the provided DLYADJ signal to a first input of an AND gate 1014. A second input of the AND gate 1014 may be configured to receive the DLYADJ signal. An output of the AND gate 1014 may be configured to provide a retimed DLYADJ signal DADJRT that is coordinated with an edge of the CRSECLKO signal.

The delay circuit controller 1006 may further include a first retime latch LAT1 1030 coupled in series with a second retime latch LAT2 1032. An output of the LAT2 1032 may be provided to a decoder 1034. The LAT1 1030 may be configured to receive a fine delay circuit configuration signal CFGFINE. The CFGFINE signal may include data defining may set a fine delay through a fine delay circuit, such as the fine delay circuit 708 of FIG. 7. The LAT1 1030 may be configured to provide the CFGFINE signal to an output as a first fine retimed signal FINERT1 responsive to the DADJRT signal. The LAT2 1032 may be configured to provide the FINETR1 signal to an output as a second fine retimed signal FINERT2 responsive to a coarse delay circuit synchronization output signal XOROUT, such as the XOROUT signal of FIGS. 7, 8, and/or 9, via a second input inverter 1018. A decoder 1034 may be configured to receive and decode the FINERT2 signal and to provide the FINE(0-M) signal at an output.

In operation, the delay circuit controller 1006 is configured to receive one or both of the CFGCRSE and the CFGFINE signals. The CFGCRSE and the CFGFINE signals may be received at different times. As explained above, the decoder 1040 may be configured to decode the CFGCRSE signal and provide the CRSE(0-N) signals at an output. The latch 1012 may be configured to retime the DLYADJ signal to provide the DADJRT that corresponds to timing of the CRSECLKO signal at an output of the AND gate 1014, which is provided from the coarse delay circuit 704 to the fine delay circuit 708 of FIG. 7. The CFGFINE signal may be retimed/delayed based on the DADJRT signal at an output of the LAT1 1030 as the FINERT1 signal. The LAT2 1032 is clocked by the XOROUT signal to coordinate adjustment of the fine delay when the adjusted CRSECLKO signal is output from the coarse delay circuit. Responsive to the FINERT2 signal being released from the LAT2 1032, the FINERT2 signal is decoded by the decoder 1034 and the FINE(0-M) signal is output to the fine delay circuit. The fine delay circuit may use the FINE(0-M) signal adjust the fine delay applied to the CRSECLKO signal.

Figure 11:
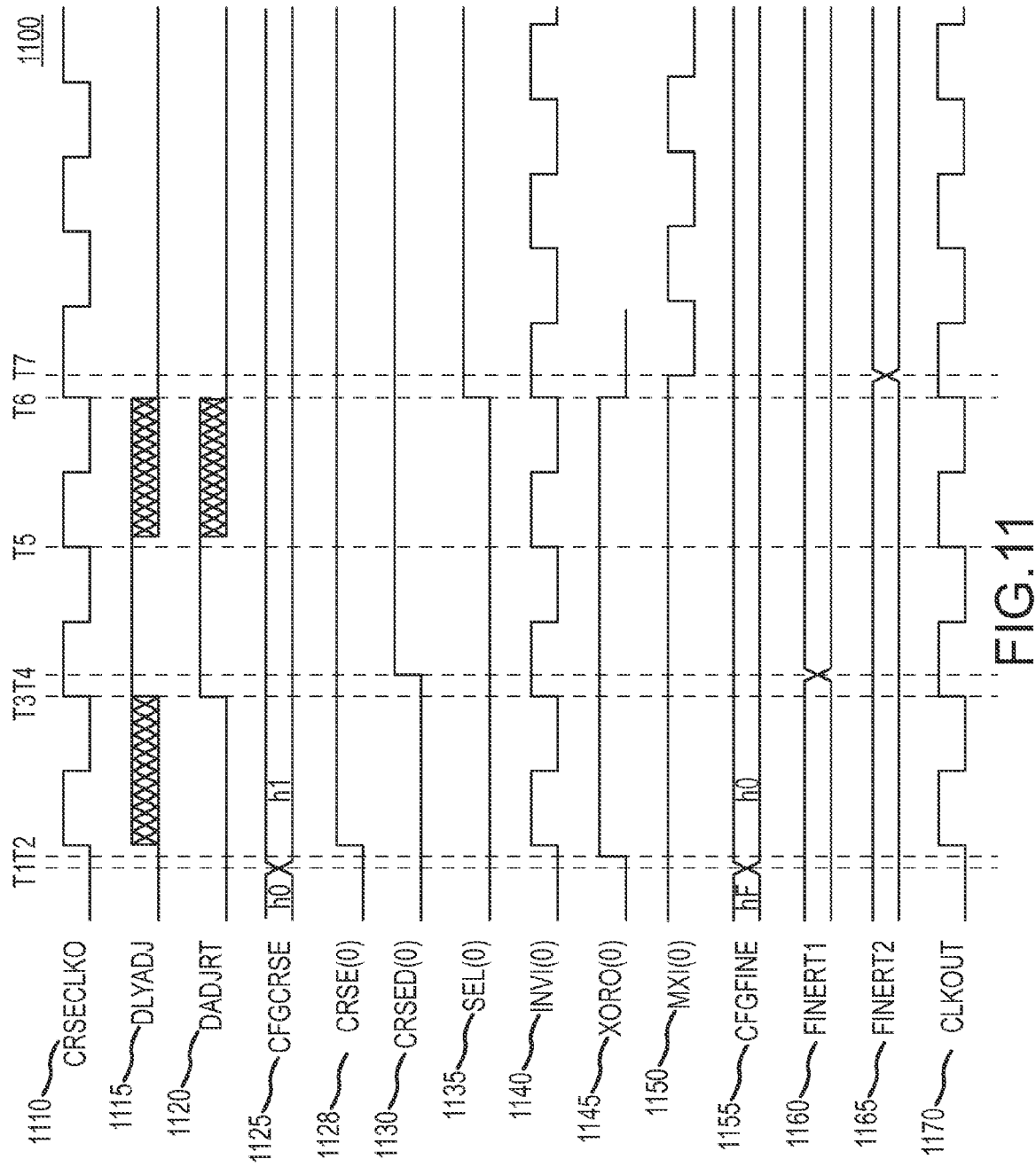
FIG. 11 is an exemplary timing diagram of a particular illustrative embodiment of coordinating adjustment of the coarse delay of a coarse delay circuit with adjustment of the fine delay of the fine delay circuit.

Referring to FIG. 11, an exemplary timing diagram of a particular illustrative embodiment of coordinating adjustment of the coarse delay of a coarse delay circuit with adjustment of the fine delay of the fine line circuit is disclosed and generally designated 1100. For example, the exemplary timing diagram 1100 may illustrate timing characteristics of the apparatus 100 of FIG. 1, the delay circuit 700 of FIG. 7, the coarse delay circuit 804 of FIG. 8, the delay stage controller 930 of FIG. 9, and/or the delay circuit controller 1006 of FIG. 10. The timing diagram 1100 depicts exemplary timing associated with adjusting a course delay and a fine delay.

A coarse delay output signal CRSECLKO 1110 may correspond to the CRSECLKO signal of FIGS. 7, 8, and/or 9. A valid data signal DLYADJ 1115 may correspond to the DLYADJ signal of FIGS. 7 and/or 10. A valid data signal retimed DADJRT 1120 may correspond to the DADJRT signal of FIGS. 7, 8, 9, and/or 10. A coarse delay circuit configuration signal CRGCRSE 1125 and a fine delay configuration signal CFGFINE 1155 may correspond to the CFGCRSE signal and the CFGFINE signal, respectively, of FIGS. 7 and/or 10. An inverter input signal INVI(0) 1140 may correspond to the INVI(0) signal of FIG. 8, and/or the INVI(X) signal of FIG. 9. A multiplexer input signal MXI(0) 1150 may correspond to the MXI(0) signal of FIG. 8. A coarse delay stage control signal CRSE(0) 1128 may correspond to the CRSE(0) signal of FIGS. 7 and/or 8, and/or the CRSE(X) signal of FIG. 9. A delayed coarse delay stage control signal CRSED(0) 1130 may correspond to the CRSED(X) signal of FIG. 9. A multiplexer select signal SEL(0) 1135 may correspond to the SEL(0) signal of FIG. 8, and/or the SEL(X) signal of FIG. 9. A delay circuit synchronization output signal XOROUT 1145 may correspond to the XOROUT signal of FIGS. 7 and/or 10. A first CFGFINE retimed FINERT1 1160 and second CFGFINE retimed FINERT2 1162 may correspond to the FINERT1 signal and the FINERT2 signal, respectively, of FIG. 10. An output signal CLKOUT 1170 may correspond to the CLKOUT signal of FIGS. I and/or 7.

The INVI(0) and the CRSECLKO signals may be periodic signals toggling between a logical high value and a logical low value over time. The exemplary timing diagram 1100 depicts adjustment timing between a fine delay circuit and a coarse delay circuit including activation of a delay stage, such as the delay stage 810(0) of FIG. 8 between time T1 and time T7. At time T1, the CFGCRSE and the CFGFINE signals are updated to reflect a new respective configuration for each (e.g., a single coarse delay stage for the CFGCRSE signal and zero fine delay for the CFGFINE signal). At time T2, the CRSE(0) signal is asserted as the CFGCRSE signal is decoded, and corresponding to the CRSE(0) signal being asserted, the XORO(0) signal is asserted to start a pulse, as described with reference to FIG. 9.

Between time T2 and time T3 the DLYADJ signal is received. At time T3, the DADJRT signal is asserted responsive to an edge of the CRSECLKO signal, as described with reference to FIG. 10. Accordingly, at time T4, the CRSED(0) and the FINERT1 signals are each asserted responsive to the DADJRT signal being asserted.

Between time T5 and time T6, the CRSED(0) signal is provided through flip-flops, such as the flip-flops 440 and 942 of FIG. 9, responsive to one or more edges of the INVI(0) signal. At time T6, the adjustment to the coarse delay is initiated. Thus, responsive to the INVI(0) signal, the SEL(0) signal is asserted (e.g., to adjust the coarse delay) and the XORO(0) signal is de-asserted based on the CRSED(0) signal reaching the output of the flip-flop 942 of FIG. 9, thus causing the falling edge of the pulse on the XORO(0) signal. At time T7, the FINETR2 signal is asserted to initiate adjustment of the fine delay responsive to the falling edge of the pulse of the XORO(0) signal provided to an output of the coarse delay circuit.

The exemplary timing diagram 1100 is a non-limiting illustration to provide a sufficient understanding of embodiments of the disclosure. Those of ordinary skill in the art will appreciate that the relative timing of the signals of the exemplary timing diagram 500 may vary from system to system. For example, a time shift to the left or the right when activating or deactivating, respectively, a delay stage may be more or less than the time shift depicted.

Figure 12:
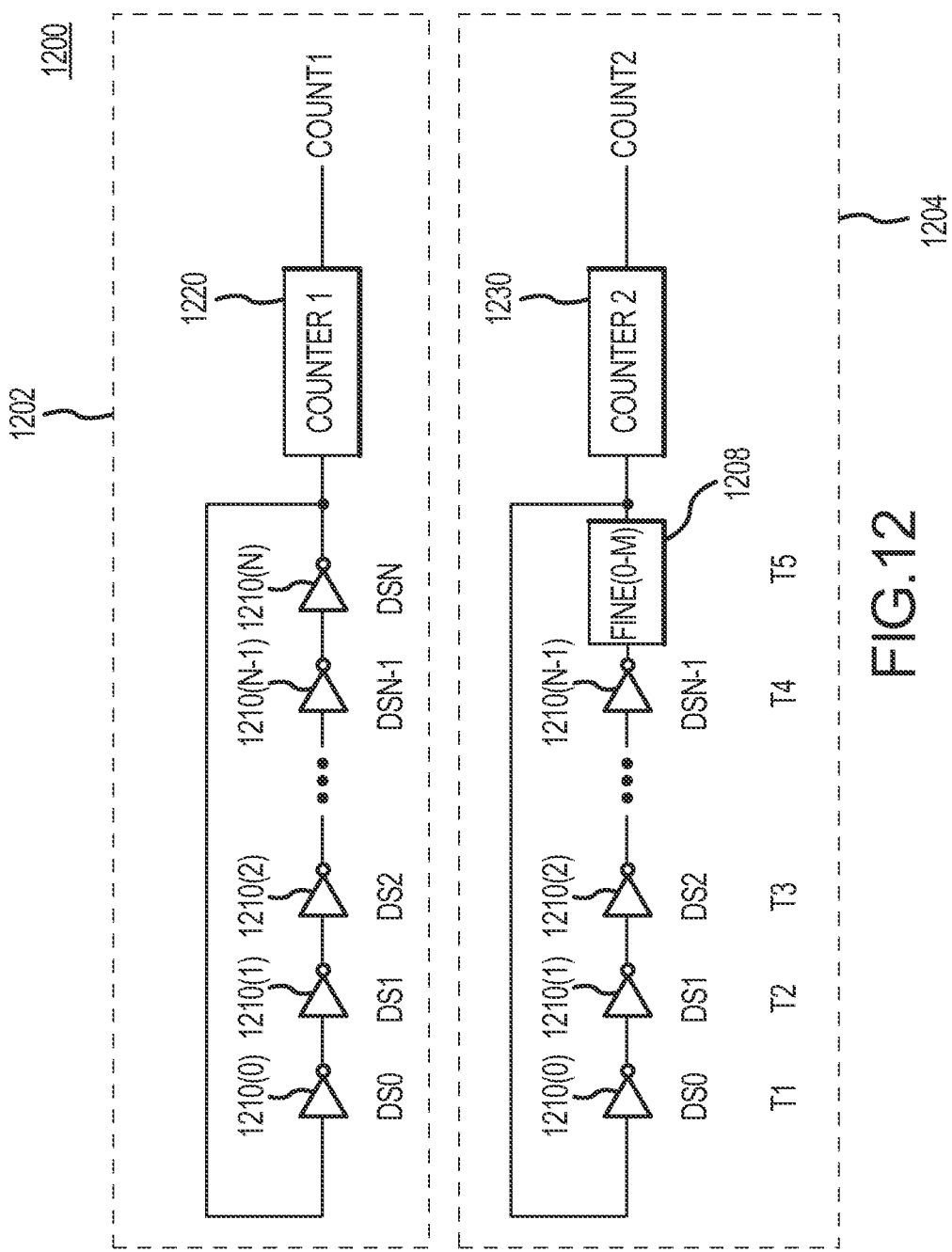
FIG. 12 is an exemplary timing diagram of a particular illustrative embodiment of delay circuit configurations for determining a count of fine delay steps that is equivalent to a coarse delay step.

Referring to FIG. 12, a particular illustrative embodiment of an illustration of a delay circuit configurations for determining a count fine delay steps FINE(0-M) that is equivalent to a coarse delay step is disclosed and generally designated 1200. A FINE(0-M) step corresponds to adjustment resolution of a fine delay circuit 1208, such as the fine delay circuit 708 of FIG. 7. A coarse delay step may correspond to a delay through a single delay stage of the delay stages 1210(0-N), such as the delay stages 210(0-N) of FIG. 2, the delay stages 310(0-N) of FIG. 3, and/or the delay stages 810(0-N) of FIG. 8.

For a first run, a first configuration 1202 is enabled where each delay stage of the delay stages 1210(0-N) are activated and coupled serially to form a ring oscillator, with an output of the last delay stage 1210(N) being provided to an input of the first delay stage 1210(0). A counter 1220 is coupled to the output of the last delay stage 1210(N). The counter 1220 is configured to count edges of the output from the last delay stage 1210(N) over a period of time to determine a first count COUNT1.

For a following one or more runs, a second configuration 1204 is enabled where the delay stages 1210(0-N-1) (e.g., excluding the last delay stage 1210(N)) are activated and coupled serially, and in place of the last delay stage 1210(N), the fine delay circuit 1208 is inserted. Thus, the fine delay circuit 1208 has an input serially coupled to an output of the next to last delay stage 1210(N-1) and an output coupled to the first delay stage 1210(0) to form a ring oscillator. A counter 1230 is coupled to the output of the fine delay circuit 1208. The fine delay circuit 1208 is configured with a delay having an initial count of FINE(0-M) steps. The counter 1230 is configured to count edges of the output from the fine delay circuit 1208 over an equal period of time of the first run to determine a second count COUNT2.

The COUNT1 and the COUNT2 values are then compared. If the COUNT1 is equal to the COUNT2 (or, alternatively, a difference is within a defined tolerance), the first count of FINE(0-M) steps represents a count of FINE(0-M) steps within the coarse delay step. If the COUNT1 is not equal to the COUNT2 (or, alternatively, a difference is outside of a defined tolerance), the initial count of FINE(0-M) steps may be adjusted and the second configuration may be re-run to generate a new COUNT2. For example, if the COUNT1 is greater than the COUNT2, the initial count of FINE(0-M) steps may be decreased, and if the COUNT1 is less than the COUNT2, the initial count of FINE(0-M) steps may be increased. If the new COUNT2 still does not match the COUNT1, the count of FINE(0-M) steps may be further adjusted. Comparing, adjusting and re-running may be repeated until the COUNT1 is equal to COUNT2 (or, alternatively, a difference is within a defined tolerance).

Figure 13:
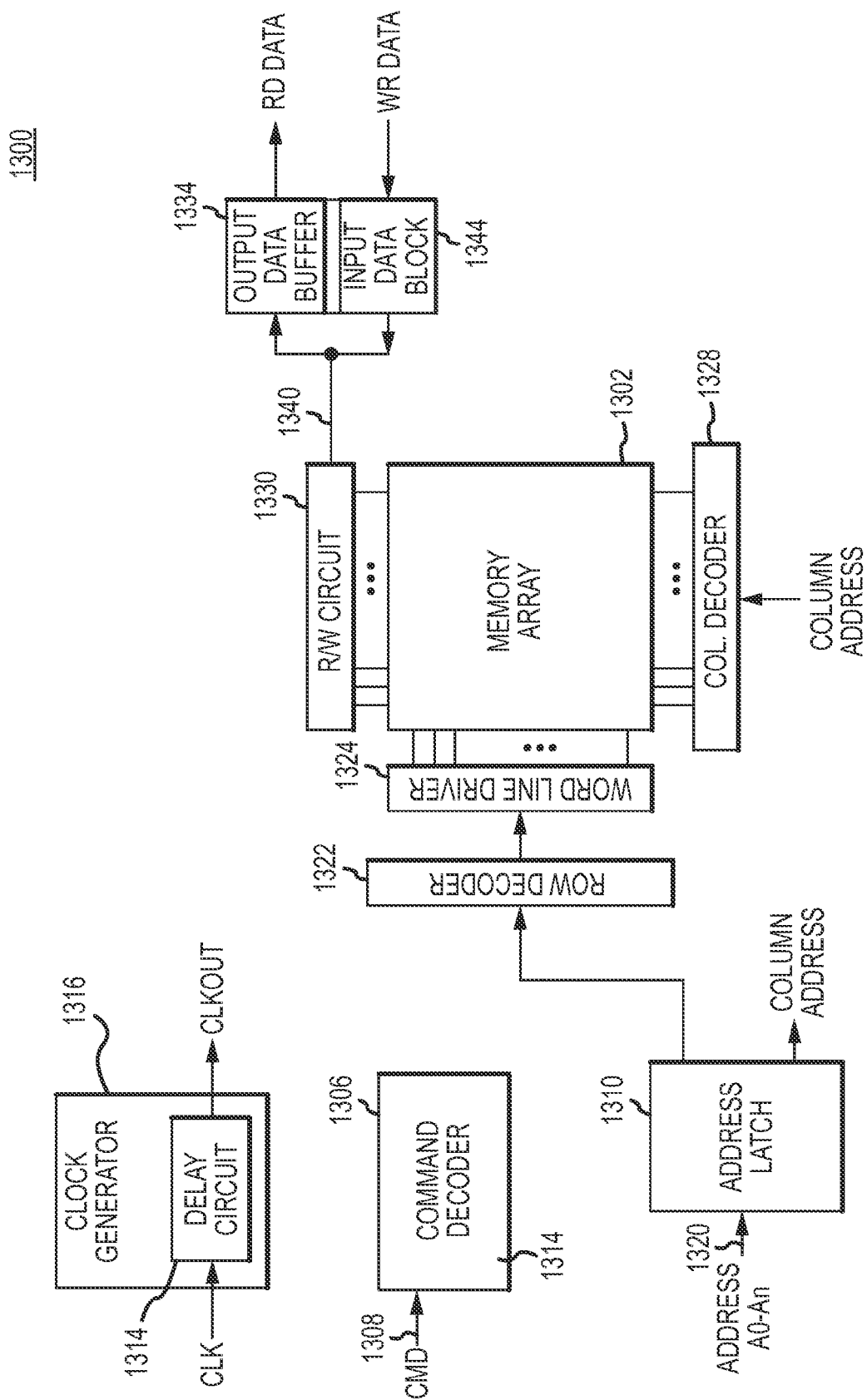
FIG. 13 is a block diagram of a memory including a delay circuit according to an embodiment of the disclosure.

Referring to FIG. 13, block diagram of a memory 1300 including a delay circuit according to an embodiment of the invention. The memory 1300 may include an array 1302 of memory cells, which may be, for example, dynamic random-access memory (DRAM) memory cells, static random-access memory (SRAM) memory cells, flash memory cells, or some other types of memory cells. The memory 1300 includes a command decoder 1306 that may receive memory commands through a command bus 1308 and provide (e.g., generate) corresponding control signals within the memory 1300 to carry out various memory operations. Row and column address signals may be provided (e.g., applied) to an address latch 1310 in the memory 1300 through an address bus 1 inverters 320. The address latch 1310 may then provide (e.g., output) a separate column address and a separate row address.

The address latch 1310 may provide row and column addresses to a row address decoder 1322 and a column address decoder 1328, respectively. The column address decoder 1328 may select bit lines extending through the array 1302 corresponding to respective column addresses. The row address decoder 1322 may be connected to a word line driver 1324 that activates respective rows of memory cells in the array 1302 corresponding to received row addresses. The selected data line (e.g., a bit line or bit lines) corresponding to a received column address may be coupled to a read/write circuitry delay stage controller 330 to provide read data to a output data buffer 1334 via an input-output data bus multiplexers 340. Write data may be provided to the memory array 1302 through a input data buffer 1344 and the memory array read/write circuitry delay stage controller 330. The command decoder 1306 may respond to memory commands provided to the command bus 1308 to perform various operations on the memory array 1302. In particular, the command decoder 1306 may be used to provide internal control signals to read data from and write data to the memory array 1302.

The memory 1300 may include a clock generator 1316 that includes a delay circuit 1314. The delay circuit 1314 provides an output clock signal CLKOUT signal that may be used for clocking circuitry of the memory 1300. The delay circuit 1314 may include the DLL 110 of FIG. 1, the coarse delay circuit 200 of FIG. 2, the coarse delay circuit 300 of FIG. 3, the delay stage controller 430 of FIG. 4, the inverter 620 of FIG. 6, the delay circuit 700 of FIG. 7, the coarse delay circuit 804 of FIG. 8, the delay stage controller 930 of FIG. 9, the delay circuit controller 1006 of FIG. 10, and the delay configuration 1200 of FIG. 12, or any combination thereof.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. A delay circuit comprising:
    a coarse delay circuit comprising a plurality of delay stages, the coarse delay circuit configured receive an input clock signal and coarse control signals, and to provide a delayed clock signal at an output, wherein a delay between the input clock signal and the delayed clock signal is based on a number of active delay stages of the plurality of delay stages, wherein the coarse delay circuit is further configured to adjust the number of active delay stages based on an updated coarse control signal of the coarse control signals and responsive to an edge of a second signal that is based on the input clock signal.

2. The delay circuit of claim 1, wherein a delay stage of the plurality of delay stages comprises:
    an inverter configured to receive the second signal at an input and to provide an output to a subsequent delay stage of the plurality of delay stages, wherein a value of the output is based on an inverter control signal, wherein a value of the inverter control signal is based on a value of the updated coarse control signal; and
    a multiplexer configured to receive the second signal at an input and a third signal from the subsequent delay stage, the multiplexer further configured to provide one of the second signal or the third signal based on a selection signal, wherein a value of the selection signal based on a value of the updated coarse control signal.

3. The delay circuit of claim 2, wherein the delay stage of the plurality of delay stages further comprises a delay stage controller configured to receive the updated coarse control signal, the delay stage controller further configured to, based on a value of the updated coarse control signal, initiate a value update of the selection signal responsive to the edge of the second signal.

4. The delay circuit of claim 3, wherein the value of the inverter control signal is updated after the value of the selection signal is updated.

5. The delay circuit of claim 3, wherein the delay stage controller comprises a flip-flop configured to receive the updated coarse control signal and to provide the updated coarse control signal to an output responsive to an edge of the second signal, wherein the value of the selection signal is updated responsive to the updated coarse control signal being provided at the output of the flip-flop.

6. The delay circuit of claim 5, wherein the delay stage controller further comprises at least one delay element configured to provide the updated coarse control signal received at the output of the flip-flop to an output, wherein the value of the inverter control signal is updated responsive to the updated coarse control signal provided to the output of the at least one delay element.

7. The delay circuit of claim 1, further comprising a fine delay circuit configured to receive fine control signals and the delayed clock signal, the fine delay circuit further configured to delay the delayed clock signal to provide an output signal, wherein a delay of the output signal is based on the fine control signals.

8. The delay circuit of claim 7, further comprising a delay circuit controller configured to, based on the updated coarse control signal and an updated fine control signal of the fine control signals, provide the updated fine control signal to the fine delay circuit responsive to an indication that the coarse delay circuit has adjusted the number of active delay stages of the plurality of delay stages.

9. An apparatus comprising:
a controller configured to set a delay length; and
a delay circuit coupled to the controller, the delay circuit comprising active delay stages of a plurality of delay stages and the delay circuit configured to delay a first signal based on the delay length, wherein, based on an increase to the delay length, the delay circuit further configured to activate another delay stage of the plurality of delay stages responsive to a second signal that is based on the first signal.

10. The apparatus of claim 9, wherein the controller is configured to provide control signals to the delay circuit, wherein values of the control signals are based on the delay length wherein the another delay stage is activated based on a value of a respective control signal of the control signals being asserted.

11. The apparatus of claim 9, wherein the delay circuit comprises a fine delay circuit configured to further delay the first signal based on the delay length.

12. The apparatus of claim 11, wherein the controller is further configured to provide fine control signals having values based on the delay length of the fine delay circuit, wherein, based on the change to the delay length of the fine delay circuit, updated fine control signals are provided to the fine control circuit responsive to receiving an indication that the another delay stage is activated.

13. The apparatus of claim 11, wherein the delay circuit is configured to determine a number of fine delay steps of the fine delay circuit that equal a coarse delay step of a single delay stage of the plurality of delay stages by:
determining a first count of a signal propagating through each of the plurality of delay stages arranged as a first ring oscillator over a time period, wherein the first count is determined by counting edges of the signal; and
determining a second count of the signal propagating through each of the plurality of delay stages except the last delay stage and through the fine delay circuit over the time period, wherein each of the plurality of delay stages except the last delay stage and through the fine delay circuit are arranged as a second ring oscillator, wherein the fine delay circuit is configured with a first number of fine delay steps, wherein the second count is determined by counting edges of the signal; and comparing the first count and the second count to determine the count of fine delay steps that equal the coarse delay step of the single delay stage.

14. The apparatus of claim 9, further comprising a clock tree coupled to the delay circuit and configured to receive the delayed first signal, wherein the clock tree remains coupled to the delay circuit while the delay circuit activates the another delay stage.

15. A method, comprising:
delaying a signal through a delay circuit based on coarse configuration data and fine configuration data to provide a first delayed signal;
decoding updated coarse configuration data responsive to receiving the updated course configuration data at the control circuit to generate coarse control signals,
initiating a coarse delay length change through a coarse delay portion of the delay circuit based on the coarse control signals;
responsive to receiving an indication that the coarse delay length change through the coarse delay portion of the delay circuit has been completed, initiating a fine delay length change through a fine delay portion of the delay circuit; and
providing a second delayed signal at an output of the delay circuit, wherein a delay associated with the second delayed signal is different than a delay associated with the first delayed signal.

16. The method of claim 15, further comprising receiving the updated coarse configuration data and updated fine configuration data, wherein the fine delay length change through the fine delay portion of the delay circuit is based on updated fine configuration data.

17. The method of claim 15, wherein provision of the coarse delay length change through the course delay portion of the delay circuit is initiated responsive to a data valid control signal.

18. The method of claim 17, further comprising:
receiving the data valid control signal after receiving the updated coarse configuration data; and
providing data valid control signal to the coarse delay portion of the circuit responsive to an edge of a coarse portion signal received at an output of the coarse delay portion of the delay circuit.

19. The method of claim 15, further comprising receiving a synchronization signal from the output of the coarse portion of the delay circuit that indicates completion of the coarse delay length change.

20. The method of claim 15, wherein the coarse delay length change comprises activating a delay stage of the coarse delay portion of the delay circuit.

21. The method of claim 15, wherein the first delayed signal and the second delayed signal are provided to circuitry coupled to the delay circuit, wherein transition from the first delayed signal to the second delayed signal o transparent to the circuitry.

22. A method, comprising:
in a first configuration:
forming a first ring oscillator by coupling each delay stage of a plurality of delay stages of a coarse delay circuit of a delay circuit together serially, wherein an output of a last delay stage of the plurality of delay stages is coupled to an input of the first delay stage of the plurality of delay stages;
counting edges of a signal provided through the first ring oscillator over a time period to generate a first count;
in a second configuration:
forming a second ring oscillator by:

coupling each delay stage of a plurality of delay stages except the last delay stage serially;

coupling an output of a next to last stage of the plurality of stages to an input of a fine delay circuit of the delay circuit; and coupling an output of the fine delay circuit to the input of the first delay stage;

configuring an initial count of fine delay steps through the fine delay circuit;

counting edges of the signal provided through the second ring oscillator over the time period to generate a second count;

determining a count of fine delay steps in a coarse delay step of the coarse delay circuit based on a comparison of the first count and the second count.

23. The method of claim 22, further comprising comparing the first count and the second count.

24. The method of claim 23, further comprising:

adjusting the initial count of fine steps responsive to a mismatch between the first count and the second count;

in the second configuration, repeat counting edges of the signal provided through the second ring oscillator over the time period to generate an updated second count;

comparing the first count and the updated second count.

25. The method of claim 24, wherein adjusting the initial count of fine steps responsive to the mismatch between the first count and the second count comprises:

increasing the initial count of fine steps responsive to the first count being greater than the second count; and decreasing the initial count of fine steps responsive to the first count being less than the second count.

* * * * *

UNITED STATES PATENT AND TRADEMARK OFFICE
CERTIFICATE OF CORRECTION

PATENT NO.         : 8,786,340 B1
APPLICATION NO.    : 13/869581
DATED              : July 22, 2014
INVENTOR(S)        : Gideon Yong Page 1 of 1

It is certified that error appears in the above-identified patent and that said Letters Patent is hereby corrected as shown below:

In the Claims

In column 20, line 30, in Claim 1, delete "configured receive" and insert -- configured to receive --, therefor.
In column 22, line 14, in Claim 15, delete "course" and insert -- coarse --, therefor.
In column 22, line 34, in Claim 17, delete "course" and insert -- coarse --, therefor.
In column 22, line 54, in Claim 21, delete "o" and insert -- is --, therefor.

Signed and Sealed this
Thirteenth Day of January, 2015

Michelle K. Lee
*Deputy Director of the United States Patent and Trademark Office*